United States Patent
Tanaka et al.

(10) Patent No.: US 8,091,046 B2
(45) Date of Patent: Jan. 3, 2012

(54) SET OF MASKS, METHOD OF GENERATING MASK DATA AND METHOD FOR FORMING A PATTERN

(75) Inventors: Satoshi Tanaka, Kanagawa (JP); Koji Hashimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 947 days.

(21) Appl. No.: 12/010,933

(22) Filed: Jan. 31, 2008

(65) Prior Publication Data

US 2008/0153301 A1  Jun. 26, 2008

Related U.S. Application Data

(62) Division of application No. 10/808,299, filed on Mar. 25, 2004, now Pat. No. 7,350,181.

(30) Foreign Application Priority Data

Mar. 26, 2003 (JP) ................ P2003-086563

(51) Int. Cl.
*G06F 17/50* (2006.01)
*H01L 21/311* (2006.01)

(52) U.S. Cl. .......................... 716/50; 438/703
(58) Field of Classification Search .......... 716/50; 438/703
See application file for complete search history.

(56) References Cited

U.S. PATENT DOCUMENTS

| 5,364,716 | A | 11/1994 | Nakagawa et al. |
| 6,589,801 | B1 * | 7/2003 | Yoon et al. ........... 438/15 |
| 6,710,847 | B1 | 3/2004 | Irie |
| 2002/0160281 | A1 | 10/2002 | Subramanian et al. |
| 2002/0160590 | A1 | 10/2002 | Hashimoto et al. |
| 2002/0187406 | A1 | 12/2002 | Magome et al. |
| 2003/0106037 | A1 | 6/2003 | Moniwa et al. |
| 2003/0154461 | A1 | 8/2003 | Pierrat |
| 2004/0058255 | A1 | 3/2004 | Jessen et al. |
| 2004/0123266 | A1 | 6/2004 | Egorov et al. |

FOREIGN PATENT DOCUMENTS

| JP | 61-216431 | 9/1986 |
| JP | 9-232233 | 9/1997 |
| JP | 2000-208408 | 7/2000 |
| JP | 2002-009056 | 1/2002 |
| JP | 2002-0055432 | 2/2002 |
| JP | 2002-182363 | 6/2002 |

OTHER PUBLICATIONS

Notification of Reasons for Refusal issued by the Japanese Patent Office on May 29, 2007, for Japanese Patent Application No. 2003-086563, and English-language translation thereof.

* cited by examiner

*Primary Examiner* — Suresh Memula
(74) *Attorney, Agent, or Firm* — Finnegan, Henderson, Farabow, Garrett & Dunner, L.L.P.

(57) ABSTRACT

A method of generating mask data, for a set of masks used to transfer a pattern for delineating a circuit pattern of a semiconductor integrated circuit, includes preparing design data having a design pattern corresponding to the pattern to be transferred on a semiconductor substrate; generating resized data by enlarging the design data by a resizing quantity; generating first mask data by filling a space area having a space width of a space quantity or less of the resized data; and generating second mask data, to be aligned with the first mask data, having a window portion for selectively exposing an area determined by enlarging the space area by the resizing quantity.

12 Claims, 37 Drawing Sheets

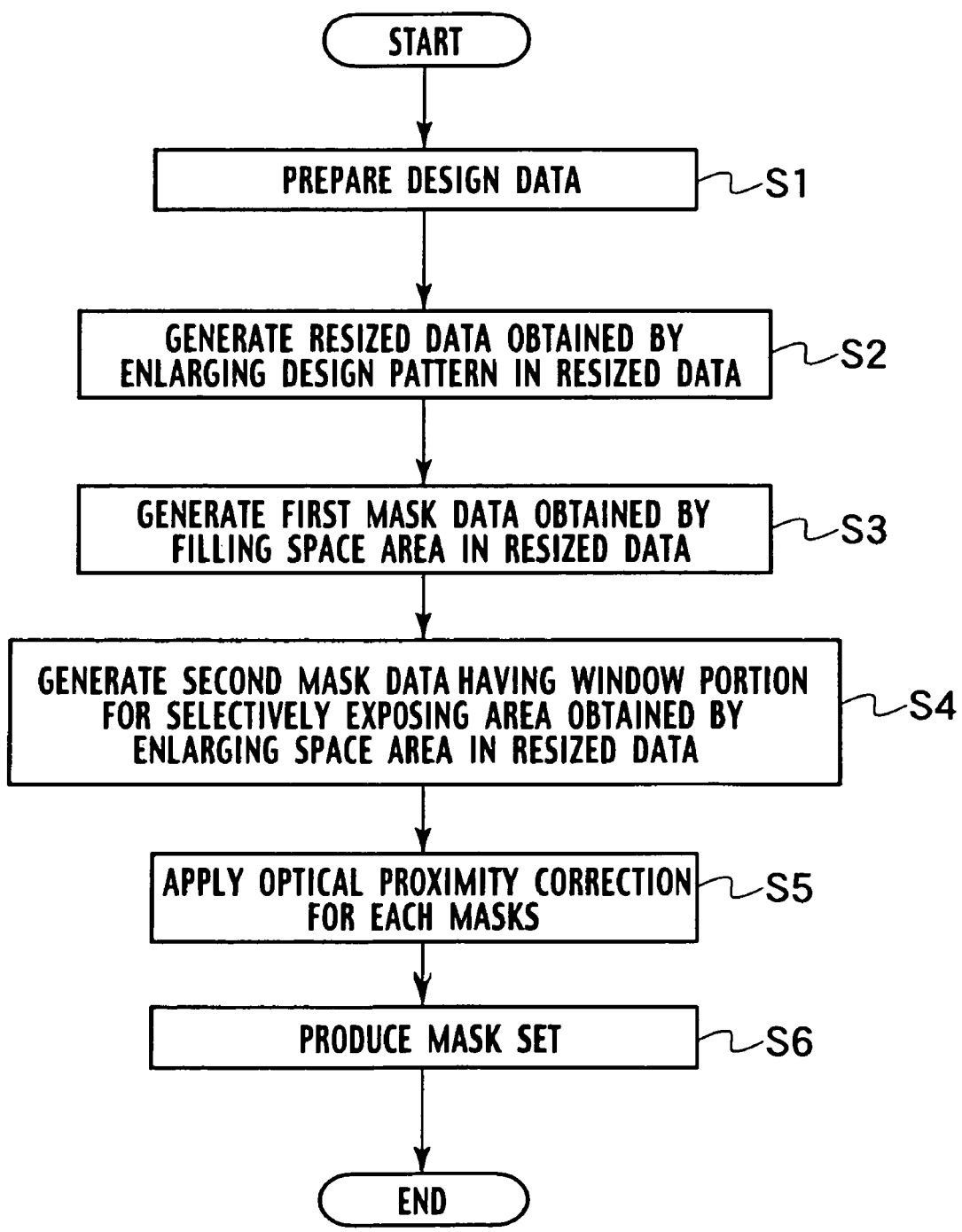

34b {34r, 34s}
33a {33r, 33s}

33a {33r, 33s}

FIG. 19A
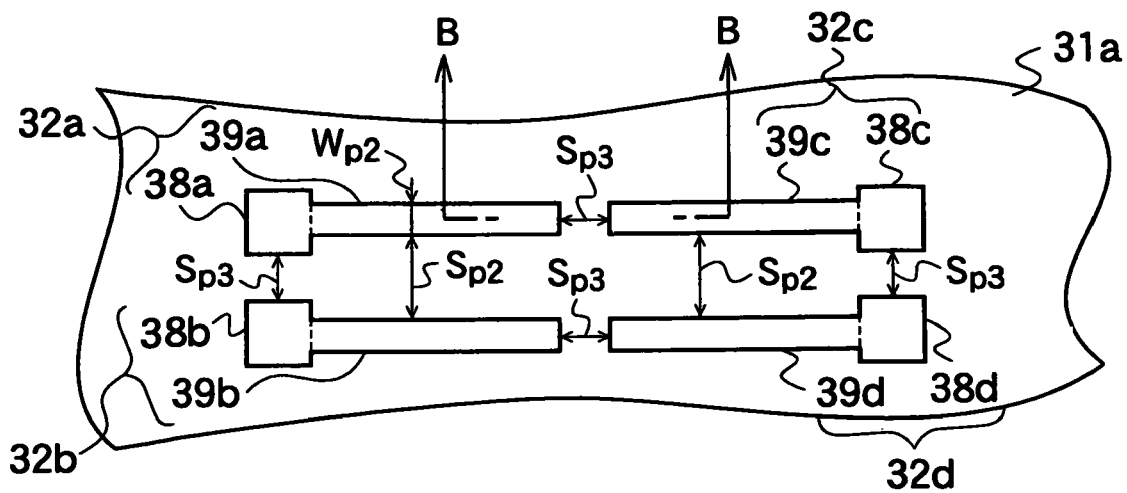
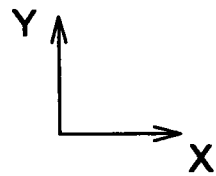
FIG. 19B
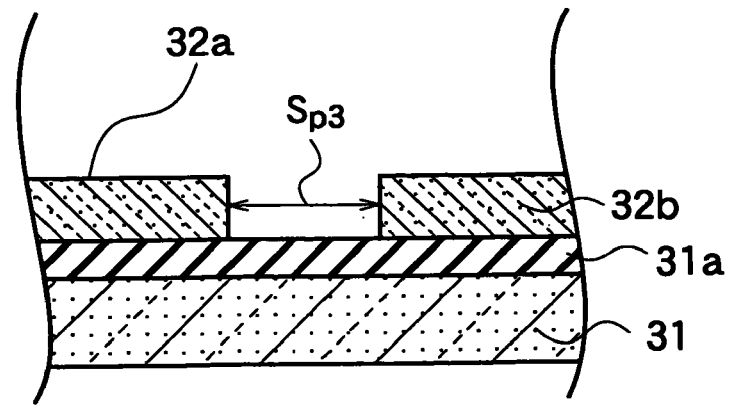

33a {33r, 33s}

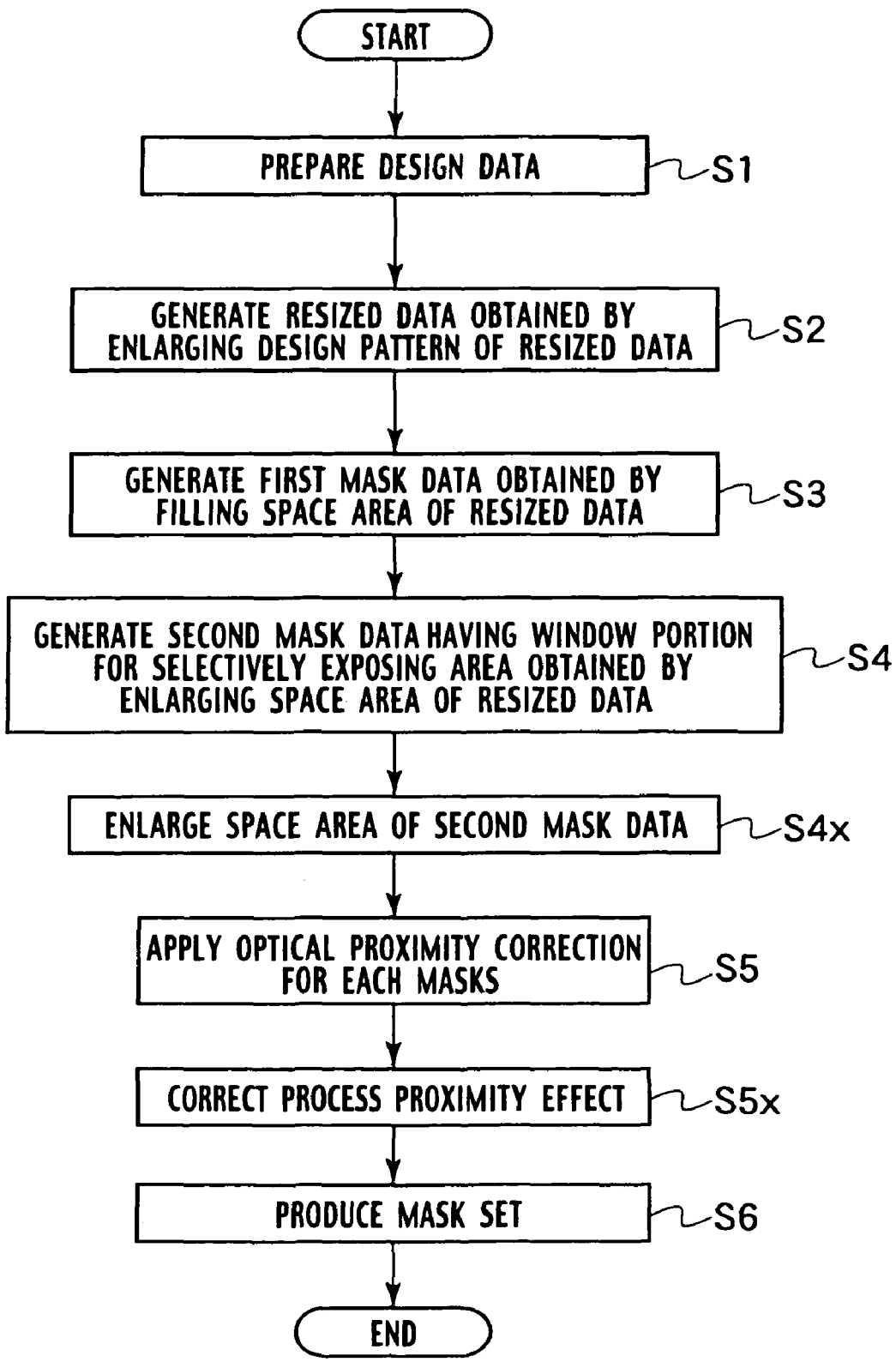

33c {33v, 33w}

SET OF MASKS, METHOD OF GENERATING MASK DATA AND METHOD FOR FORMING A PATTERN

CROSS REFERENCE TO RELATED APPLICATIONS

This is a division of application Ser. No. 10/808,299, filed Mar. 25, 2004, now U.S. Pat. No. 7,350,181 which is incorporated herein by reference.

This application is based upon and claims the benefit of priority from the prior Japanese Patent Applications No. P2003-086563, filed on Mar. 26, 2003; the entire contents of which are incorporated herein by reference.

BACKGROUND OF THE INVENTION

1. Field of the Invention

This invention relates to technology of manufacturing a semiconductor device. More especially, this invention relates to a set of masks, a method of generating mask data and a method for forming a pattern.

2. Description of the Related Art

In recent years, with the trend toward higher integration of large scale integrated circuits (LSIs), there has been a demand for finer circuit patterns of LSIs. As examples, for a transistor in a microprocessing unit (MPU), an application specific integrated circuit (ASIC), a system LSI, or the like, there is a demanded for a pattern to be delineated with fine line widths of 100 nm or less.

As a method for forming a pattern with fine line widths, there is a known method in which a resist pattern with fine line widths is formed using a positive alternating phase shift mask (Levenson-type phase shift mask) where phase contrasts of adjacent openings are shifted from each other by 180 degrees, and any unnecessary part of the resist pattern is removed using a trim mask. Moreover, as another method for forming a pattern with fine line widths, a method has been studied in which isotropic etching is performed after the formation of a resist pattern, thereby slimming the line widths of the resist pattern.

Here, for example, as to a pattern of a memory cell of a SRAM or the like which casts with a logic circuit, demand for the pattern have fine space widths in addition to fine line widths in order to reduce the circuit space. In the case of using a positive alternating phase shift mask (Levenson-type phase shift mask), it is required to form fine space widths when a trim mask is used. However, the resolution of a trim mask is low, and it is therefore difficult to form fine space widths in a resist pattern. Moreover, in the case of performing isotropic etching after the formation of a resist pattern, the space widths between the lines of the resist pattern are increased when the line widths of the resist pattern are slimmed. Therefore, it is difficult to delineate a circuit pattern which has fine line widths and fine space widths at the same time.

SUMMARY OF THE INVENTION

A feature of the present invention inheres in a method of generating mask data for a set of masks used to transfer a pattern for delineating a circuit pattern of a semiconductor integrated circuit. The method includes preparing design data having a design pattern corresponding to the pattern to be transferred on a semiconductor substrate; generating resized data by enlarging the design data by a resizing quantity; generating first mask data by filling a space area having a space width of a space quantity or less of the resized data; and generating second mask data, to be aligned with the first mask data, having a window portion for selectively exposing an area determined by enlarging the space area by the resizing quantity.

Another feature of the present invention inheres in a method for forming a pattern including depositing a process-target film on a semiconductor substrate; depositing an underlying mask film on the process-target film; delineating a first resist film on the underlying mask film; delineating a first resist pattern by transferring a pattern of a first mask onto the first resist film; delineating an underlying mask pattern having narrower line width than a line width of the first resist pattern by removing a part of the underlying mask film; delineating a second resist film on the underlying mask pattern; delineating a second resist pattern having a window portion for exposing a part of the underlying mask pattern, by transferring a pattern of a second mask onto the second resist film; and removing a part of the underlying mask pattern selectively, using the second resist pattern as an etching mask.

Additional feature of the present invention inheres in a set of masks for forming thin line portion having a line width thinner than a minimum line width which can be optically resolved by a projection exposure system by slimming a line width of a pattern transferred on a semiconductor substrate. The set of masks includes a first mask having the thin line pattern for forming the thin line portion; and a second mask having a window portion for removing an unnecessary portion from a pattern transferred by the first mask.

BRIEF DESCRIPTION OF DRAWINGS

FIG. 7 is a flowchart for explaining an example of a method of generating mask data according to the first embodiment of the present invention.

FIG. 19A is a plane view in process after process shown in FIG. 18 for explaining an example of a method for forming a pattern according to the first embodiment of the present invention.

FIG. 19B is a sectional view at B-B shown in FIG. 19A.

FIG. 30 is a flowchart for explaining an example of a method of generating mask data according to the second embodiment of the present invention.

DETAILED DESCRIPTION OF THE INVENTION

Figure 1:
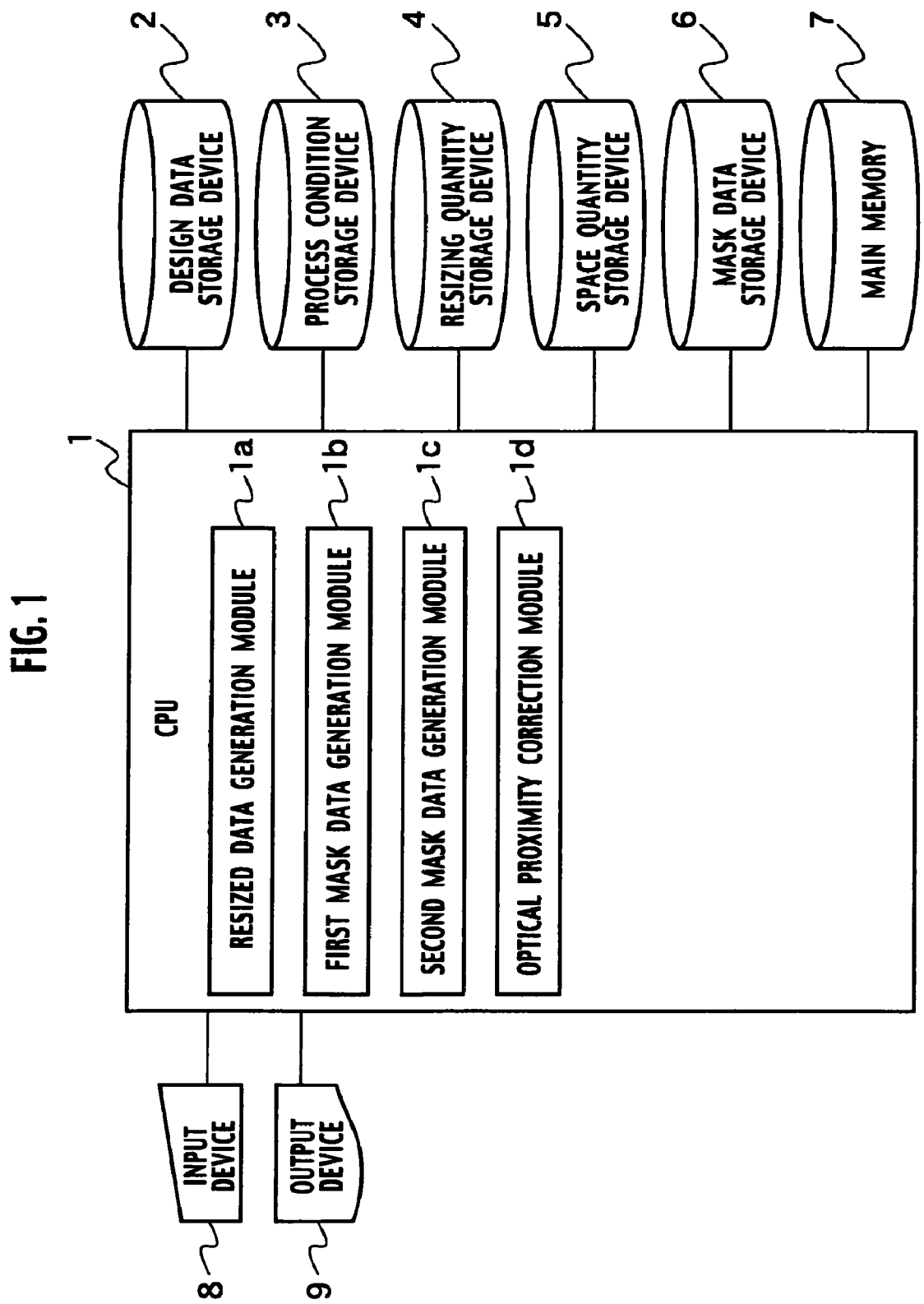
FIG. 1 is a block diagram showing an example of mask data generation system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of LSI, it will be appreciated that the various drawings are not drawn to scale from one figure to another nor inside a given figure, and in particular that the layer thicknesses are arbitrarily drawn for facilitating the reading of the drawings.

First Embodiment

As shown in FIG. 1, a mask data generation system according to a first embodiment of the present invention includes a central processing unit (CPU) 1, design data storage device 2, a process condition storage device 3, a resizing quantity storage device 4, a space quantity storage device 5, a mask data storage device 6, a main memory 7, an input device 8, and an output device 9.

The process condition storage device 3 stores process conditions, such as exposure conditions and ion implantation conditions, for delineating a circuit pattern of a semiconductor integrated circuit (IC). Here, exposure conditions also include a minimum line width and a minimum space width with which a pattern can be optically resolved by a projection exposure system used in the photolithography processes, as an example.

Figure 2:
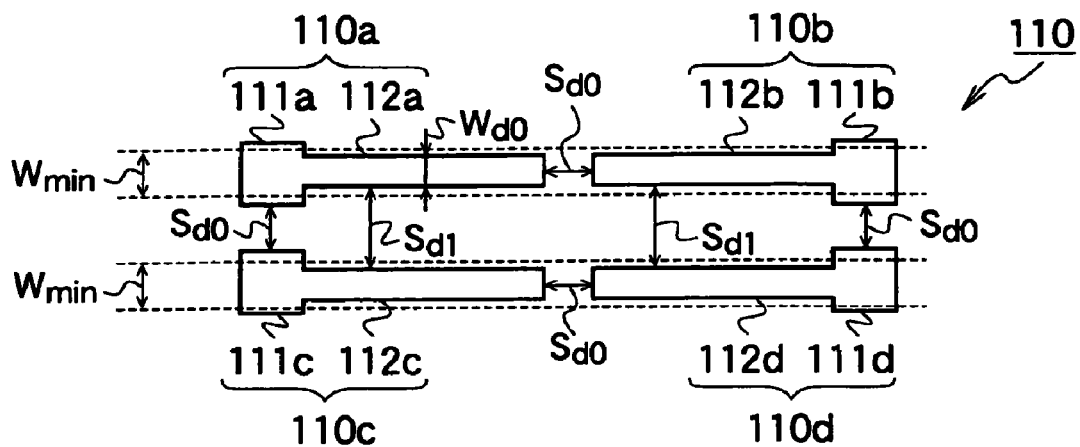
FIG. 2 is a plane view showing an example of design data according to the first embodiment of the present invention.

The design data storage device 2 stores in advance design data. The design data is drawn design patterns that correspond to patterns having desired shapes on a semiconductor substrate for delineating the circuit patterns of the semiconductor IC. For example, as shown in FIG. 2, design data 110 includes four design patterns 110a, 110b, 110c, and 110d, all of which have line symmetrical (mirror symmetrical) relationships of with one another. The design patterns 110a, 110b, 110c, and 110d include stripe-shaped thin line portions 112a, 112b, 112c, and 112d, respectively, and rectangular portions 111a, 111b, 111c, and 111d, respectively, each of which has a substantially square shape and is connected with an outer end portion of the corresponding thin line portion 112a, 112b, 112c, or 112d.

The two thin line portions 112a and 112b are separated from each other by a space width $S_{d0}$ therebetween in the X-axis direction and arranged with a line width $W_{d0}$ along a single line. The line width $W_{d0}$ is, for example, the minimum line width in the design data 110 and may be smaller than a minimum line width with which a pattern can be optically resolved by a projection exposure system used in the photolithography processes. The two thin line portions 112c and 112d are also separated from each other by the space width $S_{d0}$ therebetween in the X-axis direction and arranged with the line width $W_{d0}$ along another single line. The two thin line portions 112a and 112c are separated from each other in parallel by a space width $S_{d1}$ therebetween in the Y-axis direction. The two thin line portions 112b and 112d are also separated from each other in parallel by the space width $S_{d1}$ therebetween in the Y-axis direction. Moreover, the two rectangular portions 111a and 111c are separated from each other by a space width $S_{d0}$ therebetween in the Y-axis direction. The two rectangular portions 111b and 111d are also separated from each other by the space width $S_{d0}$ therebetween in the Y-axis direction.

Note that the design data 110 is designed based on design rules of circuit patterns of semiconductor ICs. The design rules may be stored in the design data storage device 2 shown in FIG. 1. The design rules can be appropriately determined based on the process conditions stored in the process condition storage device 3, and the like.

The resizing quantity storage device 4 stores, as a "resizing quantity," a predetermined dimension that is larger than a half value of a difference between the minimum line width with which a pattern can be optically resolved by a projection exposure system used in the photolithography processes, and the minimum line width of the design pattern drawn in the design data. The resizing quantity $\Delta D_1$ can be appropriately determined in a range which satisfies the following expression (1):

$$\Delta D_1 \geq (W_{min} - W_{d0})/2 \qquad (1)$$

where $W_{min}$ is the minimum line width with which a pattern can be optically resolved by a projection exposure system used in the photolithography processes, and $W_{d0}$ is the minimum design line width in the design data.

The space quantity storage device 5 stores, as a "space quantity," a predetermined dimension that is larger than the minimum space width with which a pattern can be optically resolved by a projection exposure system used in the photolithography processes. Based on a line width reducing quantity or the like in an etching process, the space quantity $\Delta S$ can be appropriately determined in a range which satisfies the following expression (2):

$$\Delta S > S_{min} \qquad (2)$$

where $S_{min}$ is the minimum space width with which a pattern can be optically resolved by a projection exposure system.

Figure 3:
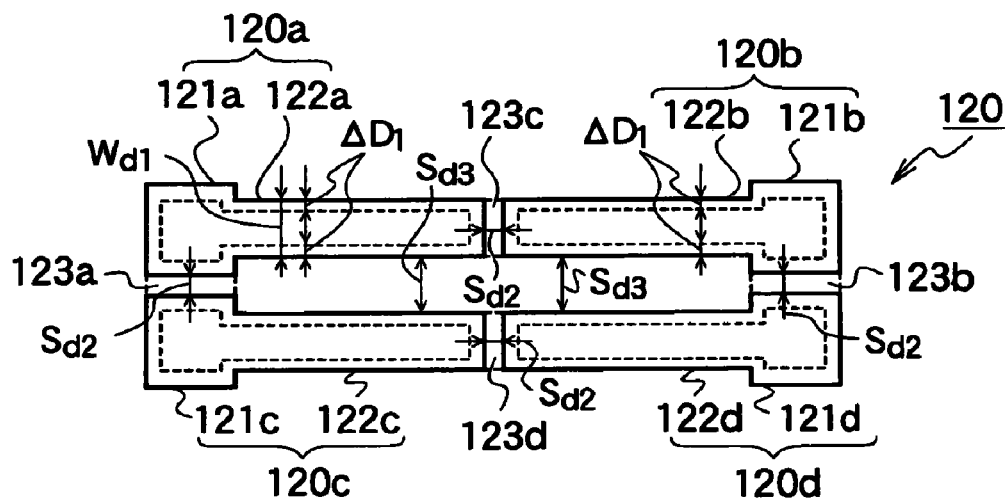
FIG. 3 is a plane view showing an example of resin data according to the first embodiment of the present invention.

The CPU 1 includes a resized data generation module 1a, a first mask data generation module 1b, a second mask data generation module 1c, and an optical proximity correction (OPC) module 1e. The resized data generation module 1a reads the design data stored in the design data storage device 2 and the resizing quantity $\Delta D_1$ stored in the resizing quantity storage device 4, and generates resized data including a resized pattern by equally enlarging a design pattern in the design data by the resizing quantity. For example, as shown in FIG. 3, the resized data generation module 1a generates resized data 120 including four resized patterns 120a, 120b, 120c, and 120d by equally enlarging the respective design patterns 110a, 110b, 110c, and 110d in the design data 110 shown in FIG. 2, each by the resizing quantity $\Delta D_1$.

The four resized patterns 120a, 120b, 120c, and 120d have the same shapes and relationships of line symmetry with one another. The resized patterns 120a, 120b, 120c, and 120d include stripe-shaped thin line portions 122a, 122b, 122c, and 122d, respectively, and rectangular portions 121a, 121b, 121c, and 121d, respectively, each of which has a substantially square shape and is connected with an outer end portion of the corresponding thin line portion 122a, 122b, 122c, or 122d. The two thin line portions 122a and 122b are separated from each other by a space width $S_{d2}$ therebetween in the X-axis direction and arranged with a line width $W_{d1}$ along a single line in the X-axis direction. The line width $W_{d1}$ is larger than the minimum line width $W_{min}$ with which a pattern can be optically resolved by a projection exposure system used in the lithography processes. The space width $S_{d2}$ is, for example, smaller than the minimum space width $S_{min}$ with which a pattern can be optically resolved by a projection exposure system. Moreover, the two thin line portions 122c, and 122d are also separated from each other by the space width $S_{d2}$ therebetween in the X-axis direction and arranged with the line width $W_{d1}$ along another single line in the X-axis direction.

The two thin line portions 122a and 122c are separated from each other in parallel by a space width $S_{d3}$ therebetween in the Y-axis direction. The thin line portions 122b and 122d are also separated from each other in parallel by the space width $S_{d3}$ therebetween in the Y-axis direction. Moreover, the rectangular portions 121a and 121c are separated from each other by the space width $S_{d2}$ therebetween in the Y-axis direction. The rectangular portions 121*b* and 121*d* are also separated from each other by the space width $S_{d2}$ therebetween in the Y-axis direction.

The first mask data generation module 1*b* shown in FIG. 1 reads the resized data generated by the resized data generation module 1*a* and the space quantity ΔS stored in the space quantity storage device 5, and generates first mask data by filling a space area, in the resized data, forming a space width smaller than the space quantity ΔS. For example, the first mask data generation module 1*b* determines areas, each having the space width $S_{d2}$, between the rectangular portions 121*a* and 121*c* between the rectangular portions 121*b* and 121*d*, between the thin line portions 122*a* and 122*b*, and between the thin line portions 122*c* and 122*d*, in the resized data 120 shown in FIG. 3, as space areas 123*a*, 123*b*, 123*c*, and 123*d*, respectively. Further, as shown in FIG. 4, the first mask data generation module 1*b* generates first mask data 130 by filling each of the space areas 123*a*, 123*b*, 123*c*, and 123*d* shown in FIG. 3.

The first mask data 130 includes two thin line patterns 131*a* and 131*b*, and a pair of connection patterns 132*a* and 132*b* which sandwich the two thin line patterns 131*a* and 131*b* at both ends thereof and connect the line patterns 131*a* and 131*b* with each other. The two thin line patterns 131*a* and 131*b* are separated from each other by the space width $S_{d3}$ therebetween in the Y-axis direction and arranged in parallel each with the line width $W_{d1}$ in the X-axis direction. The interior area surrounded by the two thin line patterns 131*a* and 131*b* and the pair of connection patterns 132*a* and 132*b* serves as a window portion 133.

Figure 5:
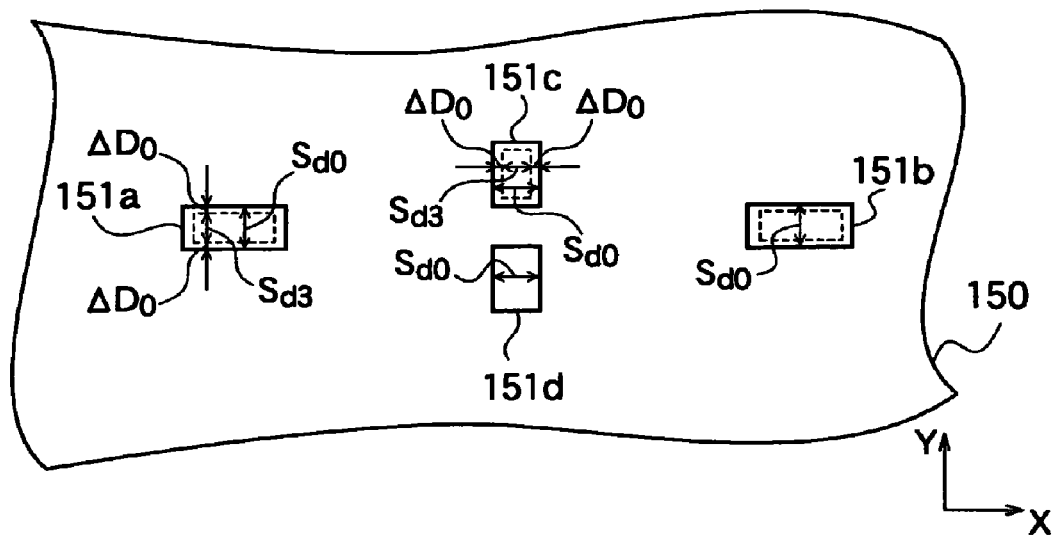
FIG. 5 is a plane view showing an example of second mask data according to the first embodiment of the present invention.

The second mask data generation module 1*c* shown in FIG. 1 reads the resized data generated by the resized data generation module 1*b* and the resizing quantity $\Delta D_1$ stored in the resizing quantity storage device 4, and generates second mask data having a window portion for selectively exposing an area determined by enlarging the space area in the resized data by the resizing quantity $\Delta D_1$. For example, as shown in FIG. 5, the second mask data generation module 1*c* generates second mask data 150 having four window portions 151*a*, 151*b*, 151*c*, and 151*d* for selectively exposing areas which are obtained by enlarging the respective space areas 123*a*, 123*b*, 123*c*, and 123*d* in the resized data 120 shown in FIG. 3, each by the resizing quantity $\Delta D_1$.

Figure 4:
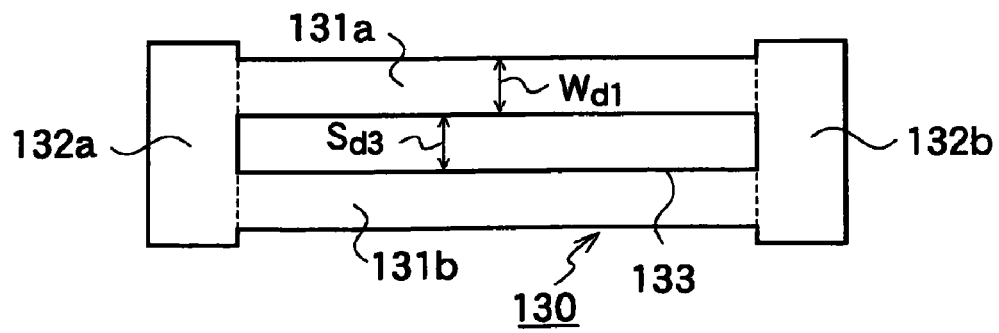
FIG. 4 is a plane view showing an example of first mask data according to the first embodiment of the present invention.

The second mask data 150 can be aligned with the first mask data 130 shown in FIG. 4. The two window portions 151*a* and 151*b* are patterns for selectively exposing parts of the connection patterns 132*a* and 132*b* with the space width $S_{d0}$, at the positions of the space areas 123*a* and 123*b*, respectively. The two window portions 151*c* and 151*d* are also patterns for selectively exposing parts of the thin line patterns 131*a* and 131*b* with the space width $S_{d0}$, at the positions of the space areas 123*c* and 123*d*, respectively.

The OPC module 1*d* shown in FIG. 1 reads the first mask data generated by the first mask data generation module 1*b*, the second mask data generated by the second mask data generation module 1*c*, and an OPC quantity included in the exposure conditions stored in the process condition storage device 3. The OPC module 1*d* then performs OPC on each of the first and second mask data so that each of the first and second mask data has a resist shape after exposure process.

Figure 6A:
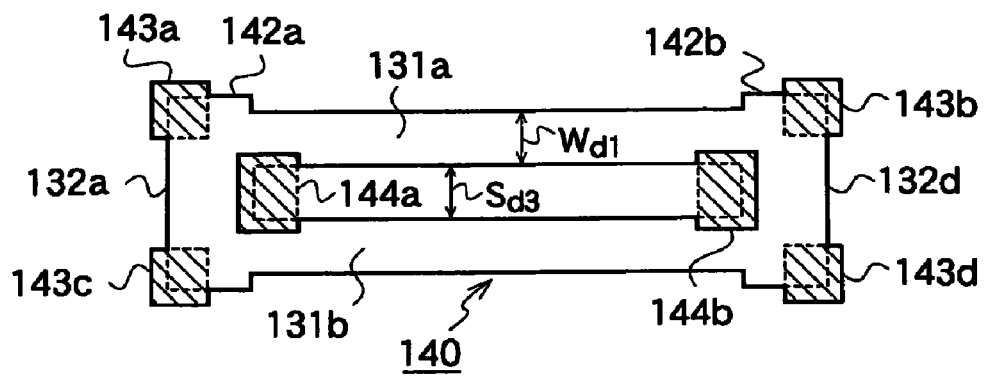
FIG. 6A is a plane view showing an example of the first mask data on which optical proximity correction is performed according to the first embodiment of the present invention.
Figure 6B:
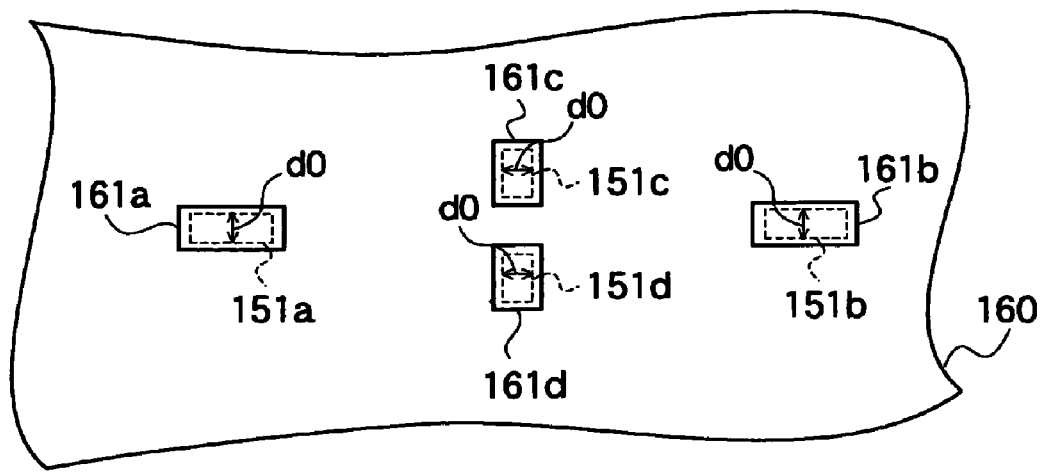
FIG. 6B is a plane view showing an example of the second mask data on which optical proximity correction is performed according to the first embodiment of the present invention.

For example, the OPC module 1*d* performs OPC on the first mask data 130 shown in FIG. 4. As shown in FIG. 6A, the OPC module 1*d* adds rectangular positive OPC patterns 143*a*, 143*b*, 143*c*, and 143*d*, as well as rectangular cut-out patterns (negative OPC patterns) 144*a* and 144*b*. The positive OPC patterns 143*a*, 143*b*, 143*c*, and 143*d* are partially superimposed on four outer corners of the connection patterns 132*a* and 132*b*. The negative OPC patterns 144*a* and 144*b* are partially superimposed on part of the two thin line patterns 131*a* and 131*b* and part of the connection patterns 132*a* and 132*b* each in a C-shape, in the vicinities of both ends of the window portion 133 in the X-axis direction. Moreover, the OPC module 1*d* performs OPC on the second mask data 150 shown in FIG. 5. As shown in FIG. 6B, the OPC module 1*d* adds such negative OPC patterns 161*a*, 161*b*, 161*c*, and 161*d* so as to cover the window portions 151*a*, 151*b*, 151*c*, and 151*d*, respectively.

As input device shown in FIG. 1, may be for example, a keyboard, a mouse, a recognition device such as an optical character readers (OCR), a drawing input device such an image scanner, or a special input device such a voice input device. The output device 9 can display the design data 110, the resized data 120, the first mask data 130 and 140, the second mask data 150 and 160 and the like with a monitor, and can print such data. The output device 9 may be a display device such a liquid crystal display (LCD), CRT display, or a printing device such a ink jet printer or a laser printer.

The main memory 7 has a read-only memory (ROM) and a random-access memory (RAM). The ROM serves as a program storage device for storing a program executed by the CPU 1 (the details of the program are described later.). The RAM serves as a temporary data memory for storing data used in executing a program by the CPU 1, and used as a working domain. As the main memory 7, a semiconductor memory, a magnetic disk, an optical disc, a magneto-optical disc and a magnetic tape, can be used. Specifically, a flexible disk, a CD-ROM, a MO disk, a cassette tape and an open reel tape, etc. can be used.

The mask data generation system shown in FIG. 1 further includes an input-output control unit (interface), which is omitted from illustration, connecting to the input device 8, the output device 9 with the CPU 1. The CPU 1 further includes a storage device management module, omitted from illustration. The storage device management module manages the design data storage device 2, the process condition storage device 3, the resizing quantity storage device 4, the space quantity storage device 5, and the mask data storage device 6.

Next, a description will be given of an example of a method of generating mask data according to the first embodiment of the present invention, referring to a flowchart of FIG. 7, and referring to FIGS. 2 to 6B as an example.

(a) In step S1 of FIG. 7, the design data 110 shown in FIG. 2 is prepared The design data 110 may be stored in advance in the design data storage device 2 shown in FIG. 1. On the other hand, the design data 110 may be input using the input device 8 and stored in the design data storage device 2. In step S2, the resized data generation module 1*a* shown in FIG. 1 reads a resizing quantity $\Delta D_1$ stored in the resizing quantity storage device 4 and the design data 110 shown in FIG. 2 stored in the design data storage device 2. The resized data generation module 1*a* then generates resized data 120 having resized patterns 120*a*, 120*b*, 120*c*, and 120*d* by equally enlarging each of the respective design patterns 110*a*, 110*b*, 110*c*, and 110*d* of the design data 110, as shown in FIG. 3, by the resizing quantity $\Delta D_1$.

(b) In step S3, the first mask data generation module 1*b* shown in FIG. 1 reads a space quantity ΔS stored in the space quantity storage device 5 and the resized data 120 shown in FIG. 3 generated in step S2. The first mask data generation module 1*b* then determines areas having space width $S_{d3}$, which is the space quantity ΔS or less from among areas which are sandwiched by the resized patterns 120*a*, 120*b*, 120*c*, and 120*d* of the resized data 120, as the space areas 123*a*, 123*b*, 123*c*, and 123*d*. Then, the first mask data generation module 1b generates first mask data 130 by filling the space areas 123a, 123b, 123c, and 123d shown in FIG. 4. In step S4, the second mask data generation module 1c shown in FIG. 1 reads the resizing quantity $\Delta D_1$ stored in the resizing quantity storage device 4, and the resized data 120 shown in FIG. 3 and generated in step S2. Then, as shown in FIG. 5, the second mask data generation module 1c generates second mask data 150 having four window portions 151a, 151b, 151c, and 151d for selectively exposing areas determined by enlarging the space areas 123a, 123b, 123c, and 123d of the resized data 120 shown in FIG. 3, by the resizing quantity $\Delta D_1$.

(c) In step S5, the OPC module 1d shown in FIG. 1 performs OPC on the first mask data 130 generated in step S3. Consequently, as shown in FIG. 6A, rectangular positive OPC patterns 143a, 143b, 143c, and 143d, and rectangular negative OPC patterns 144a and 144b are added. Furthermore, the OPC module 1d shown in FIG. 1 also performs OPC on the second mask data 150, shown in FIG. 5, generated in step S4. Consequently, as shown in FIG. 6B, negative patterns 161a, 161b, 161c, and 161d are added so as to cover the window portions 151a, 151b, 151c, and 151d. The first mask data 140 and the second mask data 160 on which OPC has been performed are stored in the mask data storage device 6 shown in FIG. 1.

(e) In step S6, the first mask data 140 and the second mask data 160 on which OPC has been performed in step S5 are converted to data for a pattern generator such an electron beam (EB) writing device respectively. Then, a set of masks which includes a first mask 10 shown in FIG. 8A and a second mask 20 shown in FIG. 9A is produced using an unillustrated pattern generator based on the converted first mask data 140 and the converted second mask data 160.

According to the method of generating mask data according to the first embodiment, it is possible to produce a set of masks which can delineat circuit patterns having both a target line width, which is smaller than the minimum line width $W_{min}$ with which a pattern can be optically resolved by a projection exposure system, and a target space width, which is the minimum space width $S_{min}$ with which a pattern can be optically resolved by a projection exposure system. Note that the method of generating mask data according to the first embodiment of the present invention is an example. The method is not limited to the procedures of the steps S1 to S6, and other various procedures can be adopted.

Moreover, the line width $W_{d0}$ of the thin line patterns 110a, 110b, 110c, and 110d does not need to be smaller than the minimum line width $W_{min}$. That is, the line width $W_{d0}$ may be equal to, or may be larger than the minimum line width $W_{min}$. When the line width $W_{d0}$ is larger than the minimum line width $W_{min}$, it is possible to obtain an increased lithography margin corresponding to a difference quantity from the minimum line width $W_{min}$ and as the resizing quantity $\Delta D_1$ in the thin line portions 112a, 112b, 112c, and 112d.

The space width $S_{d0}$ of thin line patterns 110a, 110b, 110c, and 110d does not need to be equal to the minimum space width $S_{min}$. That is, the space width $S_{d0}$ may be larger than the minimum space width $S_{min}$. When the space width is larger than the minimum space width $S_{min}$, it is possible to obtain an increased lithography margin corresponding to a difference quantity of the minimum space width $S_{min}$ in the window portions 151a, 151b, 151c, and 151d.

The procedures of Steps S1 to S6 shown in FIG. 7 can be executed by control the CPU 1 by a program (mask data generation program) which algorithms thereof equal to the procedures of Steps S1 to S6. The program includes: generating resized data by equally enlarging design patterns of design data stored in the design data storage device 2 by a resizing quantity $\Delta D_1$ stored in the resizing quantity storage device 4, by the resized data generation module 1a shown in FIG. 1; generating first mask data by filling the space areas of the enlarged resized data determined by filling space areas having a space which is a predetermined space quantity $\Delta S$ or less stored in the space quantity storage device 5 of the resized data, by the first mask data generation module 1b; generating second mask data, which can be aligned with the first mask data, having window portions for selectively exposing areas determined by enlarging the space areas by the resizing quantity $\Delta D_1$, by the second mask data generation module 1c; performing OPC on the first and second mask data by the OPC module 1d; and the like. The program may be stored in the main memory 7 and the like of the mask data generation system shown in FIG. 1. The program can be stored in a computer-readable storage medium. The procedures of the method of generating mask data can be performed, by reading the program from the computer-readable storage medium to the main memory 7.

Here, the "computer-readable storage medium" means any media and the like that can store a program, including, e.g., external memory units, semiconductor memories, magnetic disks, optical disks, magneto-optical disks, magnetic tape, and the like for a computer. To be more specific, the "computer-readable storage media" include flexible disks, CD-ROMs, MO disks, cassette tape, open reel tape, and the like. For example, the main body of the mask data generation system can be configured to incorporate a flexible disk drive and an optical disk drive, or to be externally connected thereto. A flexible disk is inserted into the flexible disk drive from a slot, a CD-ROM is inserted into the optical disk drive from a slot, and then a given readout operation is executed, whereby programs stored in these storage media can be installed on the main memory 7. In addition, by connecting given drives to the mask data generation system, it is also possible to use, for example, a ROM as a memory unit employed for a game pack or the like, and cassette tape as magnetic tape. Furthermore, it is possible to store a program in another program storage device via an information processing network, such as the Internet.

Figure 8A:
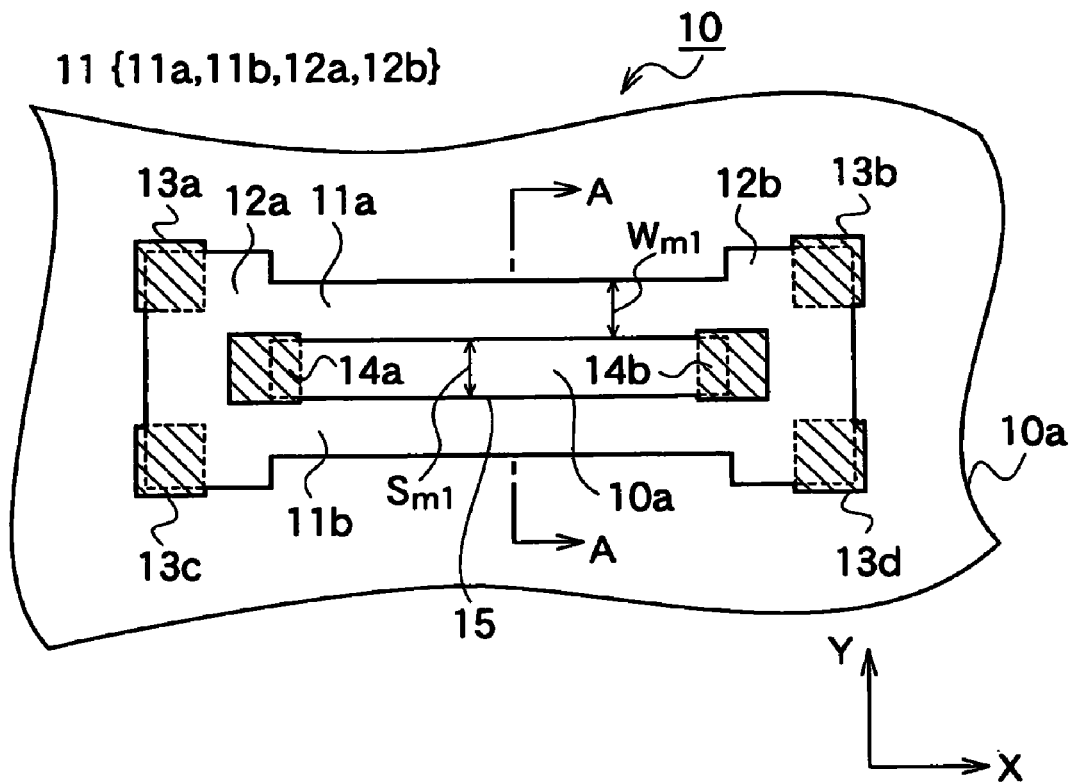
FIG. 8A is a plane view showing an example of a first mask of a set of masks according to the first embodiment of the present invention.
Figure 9A:
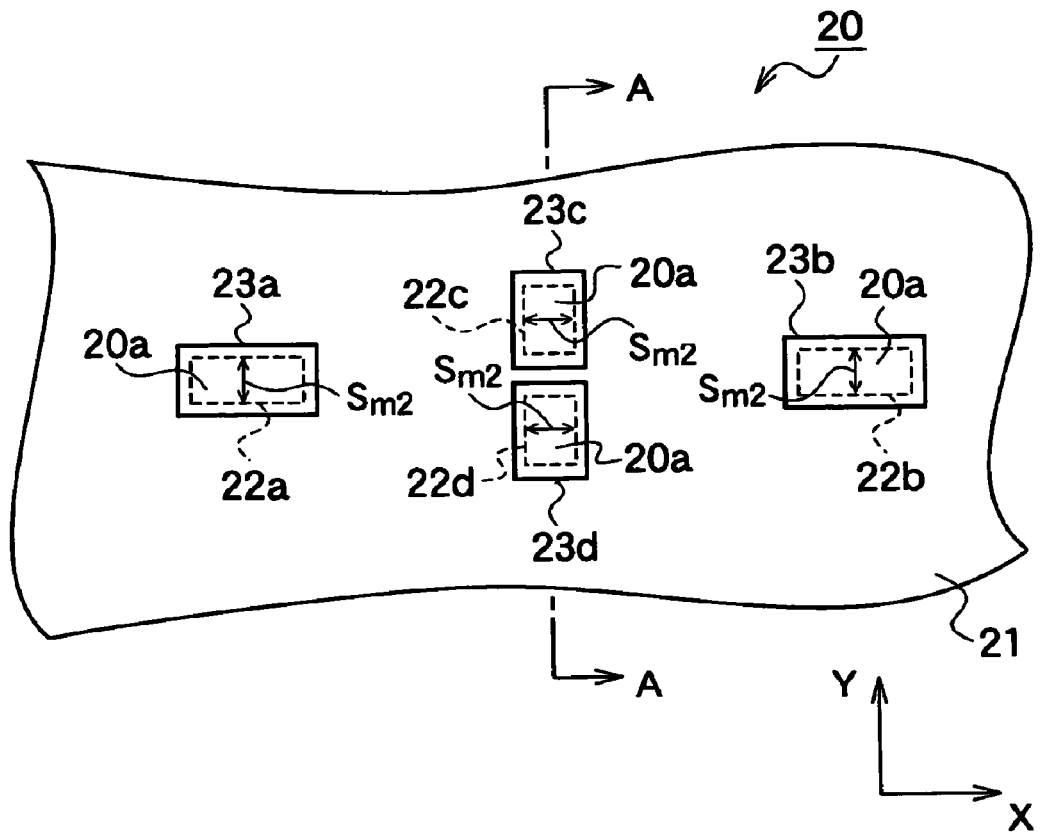
FIG. 9A is a plane view showing an example of a second mask of the set of masks according to the first embodiment of the present invention.

As shown in FIGS. 8A and 9A, the set of masks according to the first embodiment of the present invention is a set of photomasks for forming, on a target (semiconductor substrate) to be exposed, thin line portions having a line width smaller than the minimum line width $W_{min}$ with which a pattern can be optically resolved by a projection exposure system used in the photolithography processes, by slimming the line widths of patterns after exposure by a predetermined quantity. The set of masks includes the first mask 10 having thin line patterns 11a and 11b for forming the thin line portions, and the second mask 20 having window portions 23a, 23b, 23c, and 23d for removing unnecessary parts from the patterns formed by use of the first mask 10.

Figure 8B:
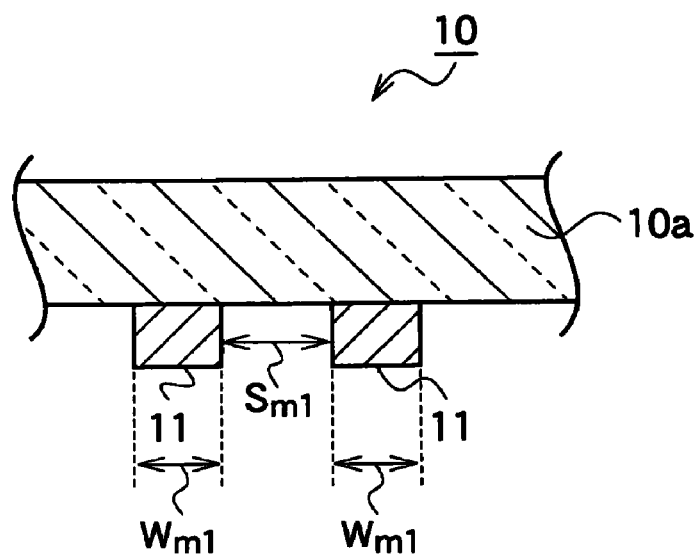
FIG. 8B is a sectional view at A-A shown in FIG. 8A.

The first mask 10 shown in FIGS. 8A and 8B includes a first mask plate 10a and a first mask pattern 11 placed on the first mask plate 10a. As shown in FIG. 8A, the first mask pattern 11 includes the two stripe-shaped thin line patterns 11a and 11b, and a pair of connection patterns 12a and 12b which sandwich the two thin line patterns 11a and 11b at both ends thereof and connect the thin line patterns 11a and 11b with each other. The thin line patterns 11a and 11b are separated from each other by a space width $S_{m1}$ therebetween in the Y-axis direction and arranged with a line width $W_{m1}$ in the X-axis direction. The first mask plate 10a is exposed at a window portion 15, the interior surrounded by the two thin line patterns 11a and 11b and the pair of connection patterns 12a and 12b.

Rectangular positive OPC patterns 13a, 13b, 13c, and 13d are respectively added to four outer corners of the pair of connection patterns 12a and 12b. Partial areas of the positive OPC patterns 13a, 13b, 13c, and 13d are superimposed on the respective corners of the connection patterns 12a and 12b. The areas of the positive OPC patterns 13a, 13b, 13c, and 13d which are not superimposed on the connection patterns 12a and 12b protrude, each in an L-shape, from the respective four outer corners of the connection patterns 12a and 12b. In addition, rectangular negative OPC patterns 14a and 14b are respectively added to both sides of the window portion 15 in the X-axis direction. The positive OPC patterns 13a, 13b, 13c, and 13d and the negative OPC patterns 14a and 14b are patterns which have been added through OPC for controlling optical proximity effects during exposure. The negative OPC patterns 14a and 14b are partially superimposed on parts of the thin line patterns 11a and 11b and parts of the connections patterns 12a and 12b. Of the entire areas of the thin line patterns 11a and 11b and the connection patterns 12a and 12b, areas on which the negative OPC patterns 14a and 14b are superimposed are each cut out in a C-shape. The first mask plate 10a is exposed at the C-shaped cut-out areas and the interior of the window portion 15.

Figure 9B:
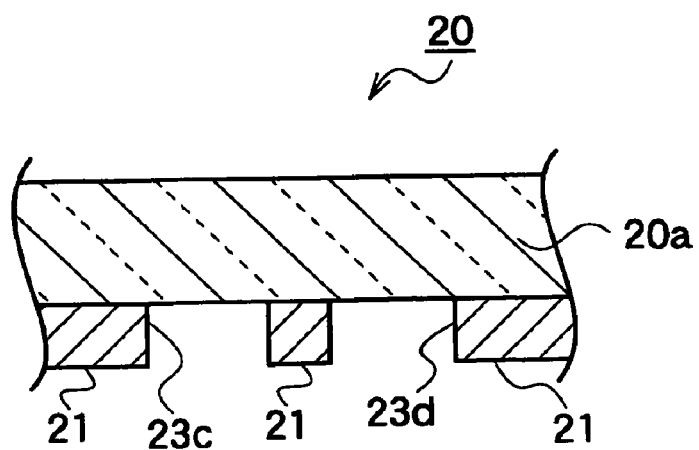
FIG. 9B is a sectional view at A-A at FIG. 9A.

On the other hand, the second mask 20 shown in FIGS. 9A and 9B includes a second mask plate 20a and a second mask pattern 21 placed on the second mask plate 20a. As shown in FIG. 9A, the second mask pattern 21 has four rectangular window portions 22a, 22b, 22c, and 22d. The two window portions 22a and 22b have the same shapes and are separated from each other along a single line in the X-axis direction. The length of sides along the Y-axis direction of the window portions 22a and 22b is equal to a space width $S_{m2}$. The two window portions 22c and 22d have the same shape. The two window portions 22c and 22d are separated from each other along a single line in the Y-axis direction and provided line-symmetrically relative to a line connecting the two window portions 22a and 22b. The length of sides along the X-axis direction of the two window portions 22c and 22d is also equal to the space width $S_{m2}$.

In the second mask pattern 21, four rectangular negative OPC patterns 23a, 23b, 23c, and 23d are provided which are superimposed on the four window portions 22a, 22b, 22c, and 22d so as to cover the window portions 22a, 22b, 22c, and 22d, respectively. Each of the negative OPC patterns 23a and 23b has a side that is longer than the space width $S_{m2}$ in the Y-axis direction. Each of the negative OPC patterns 23c and 23d has a side that is longer than the space width $S_{m2}$ in the X-axis direction. The second mask plate 20a is exposed at the interiors of the negative OPC patterns 23a, 23b, 23c, and 23d. That is, the negative OPC patterns 23a, 23b, 23c, and 23d serve as transmission patterns.

Figure 10:
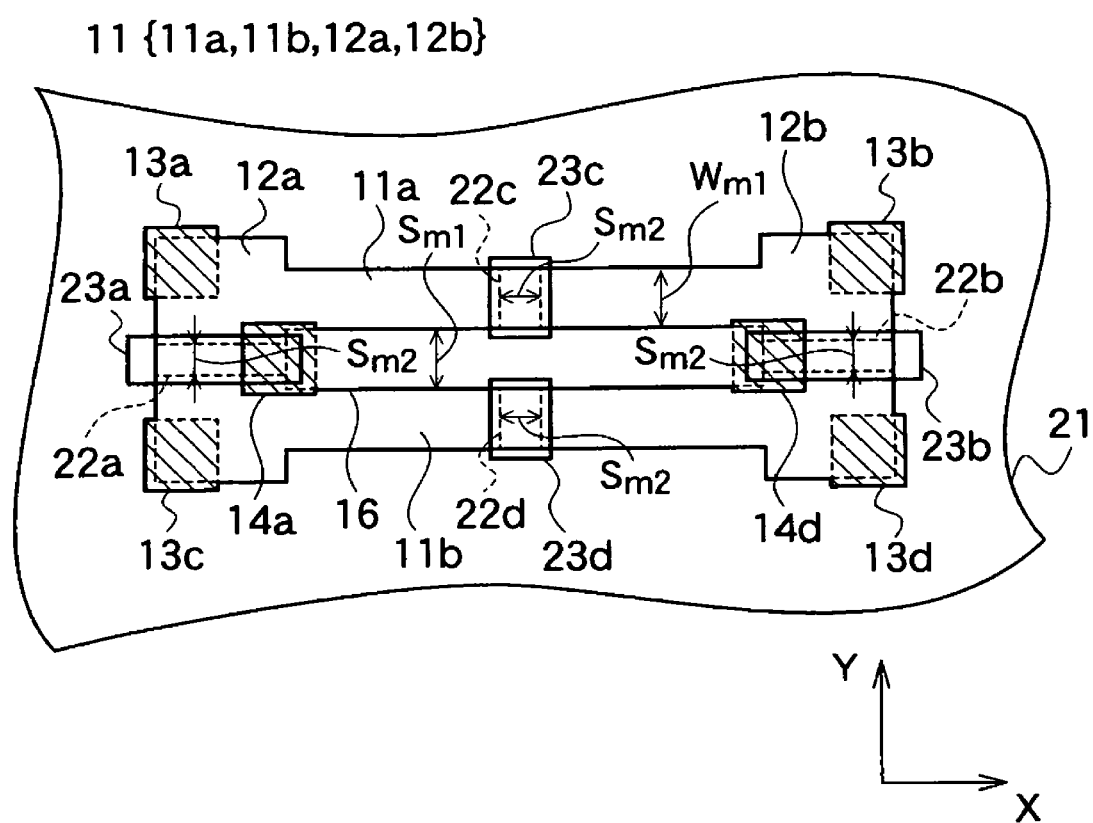
FIG. 10 is a plane view for explaining alignment between a first mask pattern and a second mask pattern of the set of masks according to the first embodiment of the present invention.

The first mask pattern 11 shown in FIG. 8A and the second mask pattern 21 shown in FIG. 9A can be aligned with each other as shown in FIG. 10. The window portions 22a and 22b of the second mask pattern 21 are aligned, on the basis of the space width $S_{m2}$ in the Y-axis direction, with the center portions of the connection patterns 12a and 12b of the first mask pattern 11, respectively. That is, the window portions 22a and 22b are each patterns for dividing a pattern to be provided on the semiconductor substrate from the connection pattern 12a or 12b in the photolithography processes into two patterns in the Y-axis direction. The window portions 22c and 22d are aligned, on the basis of the space width $S_{m2}$ in the X-axis direction, with center portions of the thin line patterns 11a and 11b of the first mask pattern 11, respectively. That is, the two window portions 22c and 22d are each patterns for dividing a strip to be provided on the semiconductor substrate from the thin line portion 11a or 11b in the photolithography processes, into two patterns in the X-axis direction. Note that the first and second mask patterns 11 and 21 are enlarged to five (or four) times the pattern dimensions to be projected, because the reduction ratio of the optical system of a projection exposure system is ⅕ (or ¼).

As the material for the first mask plate 10a shown in FIG. 8B and of the second mask plate 20a shown in FIG. 9B, it is possible to use quartz glass, soda-lime glass, borosilicate glass, or the like. Moreover, as the material for the first and second mask patterns 11 and 21, it is possible to use chromium (Cr), a composite film of Cr and a chromium oxide ($Cr_2O_3$), or the like. Alternatively, it may be possible to adopt a translucent film employed for an attenuated phase shift mask (half tone phase shift mask), often used in a today's technology, in which a film is configured such that a mask pattern portion is translucent to exposure light and the phase of light in this portion is shifted by 180 degrees from the phase of light passing through the mask plate. For the translucent film employed for the half tone phase shift mask, it is possible to use a molybdenum silicide oxynitride ($MoSiO_xN_y$), a chromium oxide ($Cr_xO_y$), or the like.

According to the set of masks of the first embodiment, it is possible to delineate a circuit pattern including both a target line width that is smaller than the minimum line width $W_{min}$ with which a pattern can be optically resolved by a projection exposure system, and a target space width that equal to the minimum space width $S_{min}$ with which a pattern can be optically resolved by a projection exposure system.

Next, a description will be given of a method for forming a pattern according to the first embodiment of the present invention with reference to FIGS. 11 to 19B.

Figure 11:
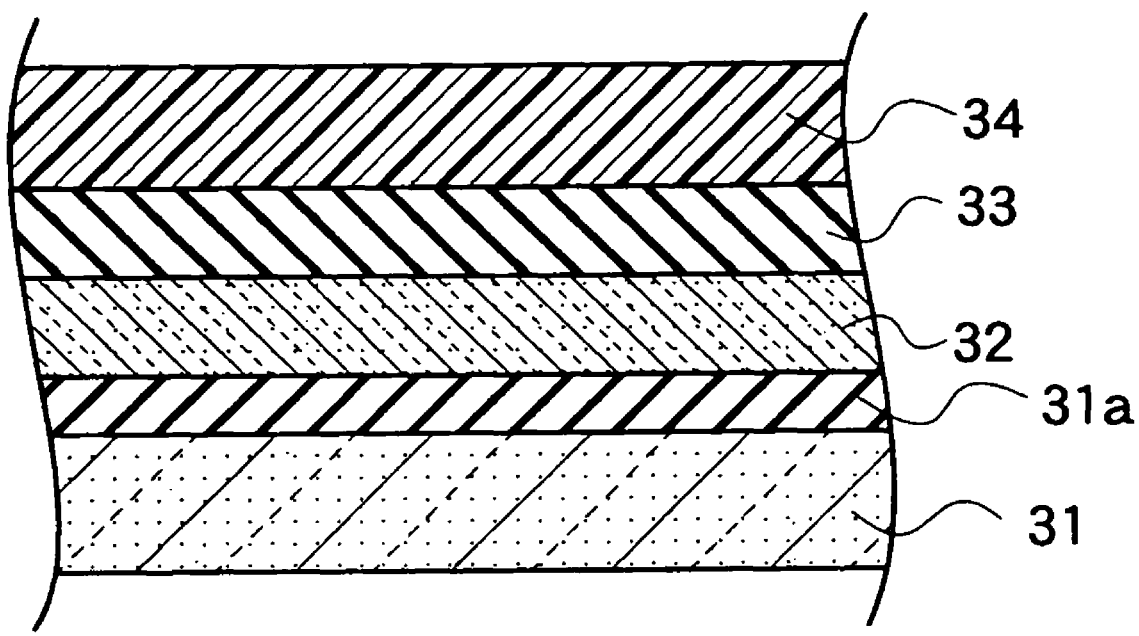
FIG. 11 is a sectional view for explaining a method for forming pattern according to the first embodiment of the present invention.

(a) First, an $n^+$ single crystal silicon wafer is prepared. Subsequently, a device area (active area) is deposited on a surface of the n+ single crystal silicon wafer. The circumference of the device area is defined by an unillustrated field oxide layer. An unillustrated plurality of n-type and p-type semiconductor areas are formed in the device area by ion implantation or the like. As a result, a semiconductor substrate 31 shown in FIG. 11 is prepared.

(b) Next, a gate oxide film (first insulator) 31a with a thickness of about 3 to 300 nm is deposited on the semiconductor substrate 31. If the gate oxide is a tunnel gate oxide, the thickness of the first insulator may be about 1.5 nm. Thereafter, a process-target film 32 made of polycrystalline silicon or the like is deposited on the first insulator 31a by chemical vapor deposition (CVD) or the like. Subsequently, an underlying mask film (second insulator) 33 is deposited on the process-target film 32 by CVD or the like. Note that if the underlying mask film 33 is a silicon nitride ($Si_xN_y$) film, a silicon oxynitride ($SiO_xN_y$) film, or the like when the process-target film 32 is made of polycrystalline silicon, etching selectivity can be ensured. The underlying mask film 33 does not need to be an insulator as long as it is a film which can ensure a sufficiently high etching rate compared with the etching rate of the process-target film 32. It is preferable that the thickness of the underlying mask film 33 be about 50 to 100 nm.

Figure 12A:
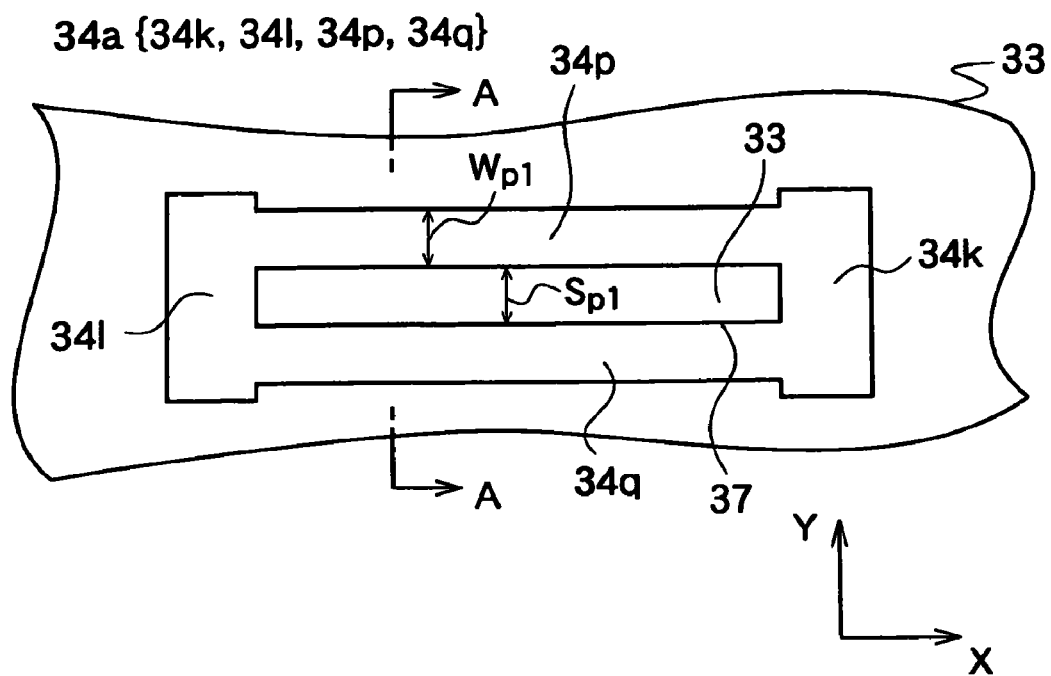
FIG. 12A is a plane view in process after process shown in FIG. 11 for explaining an example of a method for forming a pattern according to the first embodiment of the present invention.
Figure 12B:
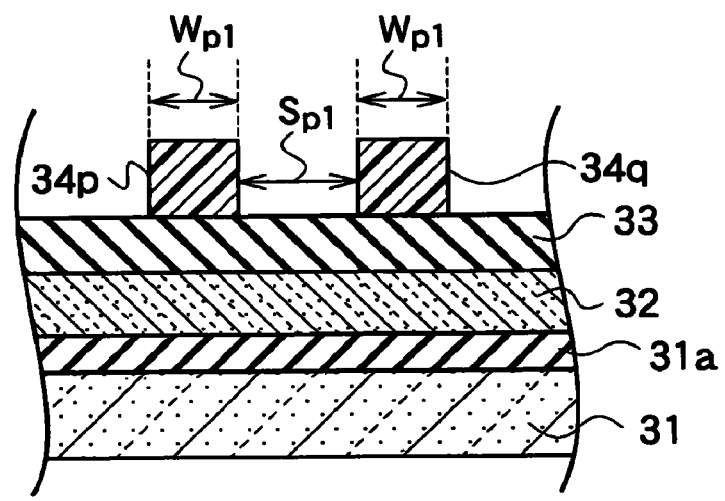
FIG. 12B is a sectional view at A-A shown in FIG. 12A.

(c) Next, a first re film 34 is spin-coated on the underlying mask film 33. Subsequently, the first mask 10 shown in FIG. 8A is mounted on an unillustrated projection exposure system, and then the pattern of the first mask 10 is reduced to, e.g., ⅕ (or ¼) and transferred onto the first resist film 34. Thereafter, the first resist film 34 is developed, and thus a first resist pattern 34a is delineated as shown in FIGS. 12A and 12B. The first resist pattern 34a includes two thin line portions 34p and 34q and a pair of connection portions 34k and 34l which sandwich the two thin line portions 34p and 34q at both ends thereof and connect the thin line portions 34p and 34q with each other. The two thin line portions 34p and 34q are separated from each other by a space width $S_{p1}$ therebetween in the Y-axis direction and arranged in parallel to each other by a line width $W_{p1}$ in the X-axis direction. Part of the base mask 33 is exposed at a window portion 37. The interior of the window portion 37 is surrounded by the two thin line portions 34p and 34q and the pair of connection portions 34k and 34l.

Figure 13A:
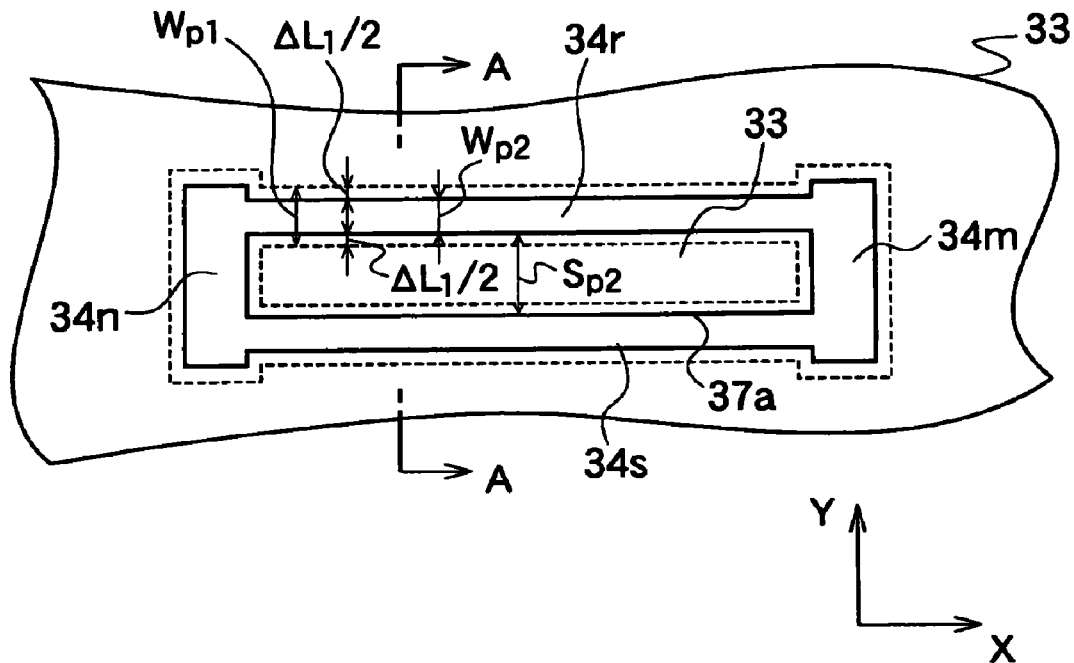
FIG. 13A is a plane view in process after process shown in FIG. 12A for explaining an example of a method for forming a pattern according to the first embodiment of the present invention.
Figure 13B:
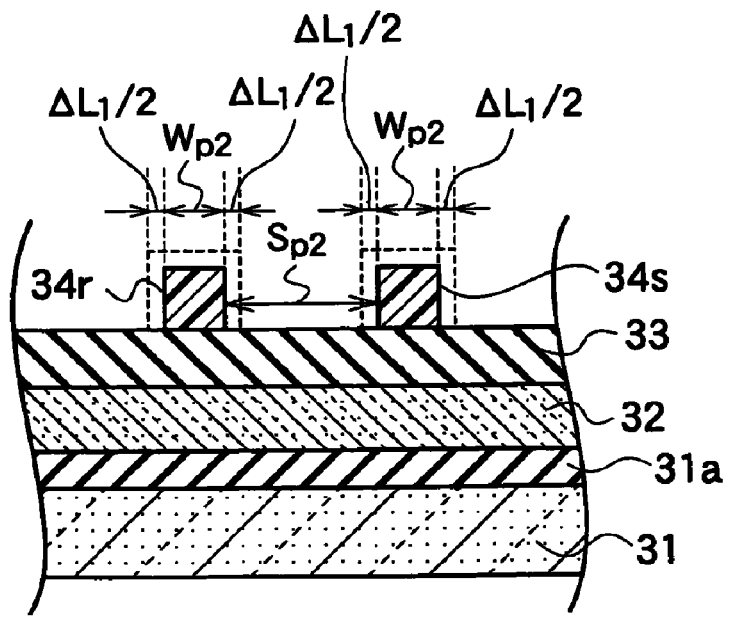
FIG. 13B is a sectional view at A-A shown in FIG. 13A.
Figure 14:
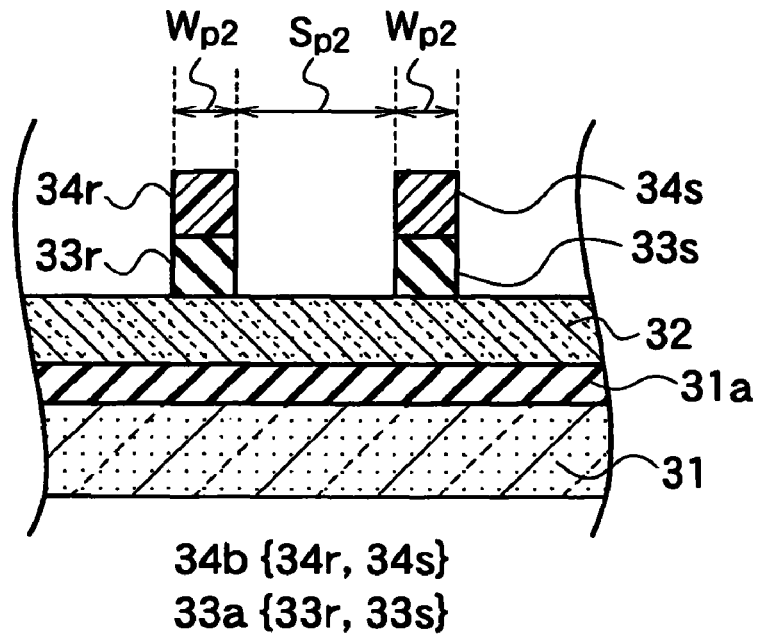
FIGS. 14 and 15 are sectional views in processes after process shown in FIG. 13B for explaining an example of a method for forming a pattern according to the first embodiment of the present invention.

(d) Next, the first resist pattern 34a is slimmed by a rehang quantity $\Delta L_1$ (=$\Delta D_1$) by plasma ashing using oxygen (O) or the like, whereby a resized resist pattern 34b is delineated as shown in FIGS. 13A and 13B. In other words, thin line portions 34r and 34s with a target line width $W_{p2}$ are formed by slimming the thin line portions 34p and 34q with the line width $W_{p1}$ which is determined by the first resist pattern 34a. The target line width $W_{p2}$ may be smaller than the minimum line width $W_{min}$ with which a pattern can be optically resolved by a projection exposure system. The resized resist pattern 34b includes the two thin line portions 34r and 34s and a pair of connection portions 34m and 34n which sandwich the two thin line portions 34r and 34s at both sides thereof and connect the thin line portions 34r and 34s with each other. The two thin line portions 34r and 34s are separated from each other by a space width $S_{p2}$ therebetween and arranged in parallel to each other by the target line width $W_{p2}$ in the X-axis direction. The underlying mask film 33 is exposed at a window portion 37a. The interior of the window portion 37a is surrounded by the two thin line portions 34r and 34s and the pair of connection portions 34m and 34n. With the resized resist pattern 34b as an etching mask, part of the base mask 33 is selectively removed by reactive ion etching (RIE) or the like. As a result, thin line portions 33r and 33s and connection portions (not shown) of an underlying mask pattern (insulator pattern) 33a as shown in FIG. 14 are delineated. The resized resist pattern 34b is removed by use of a resist remover or the like.

Figure 15:
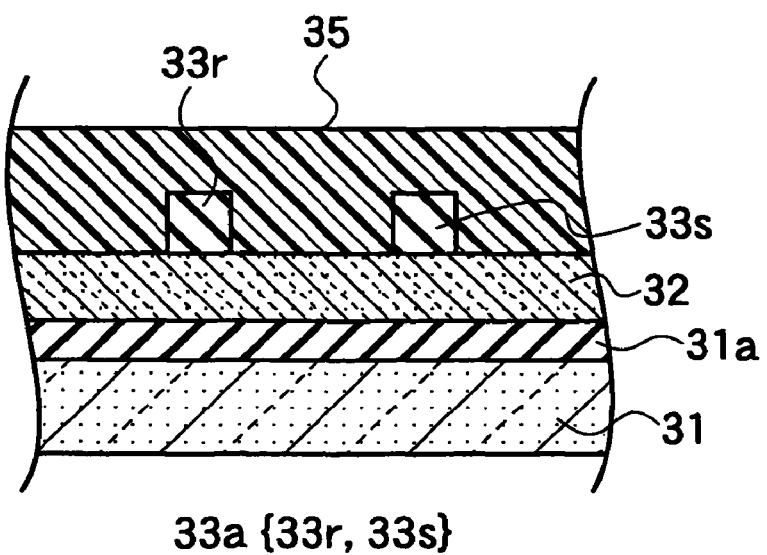
Figure 16A:
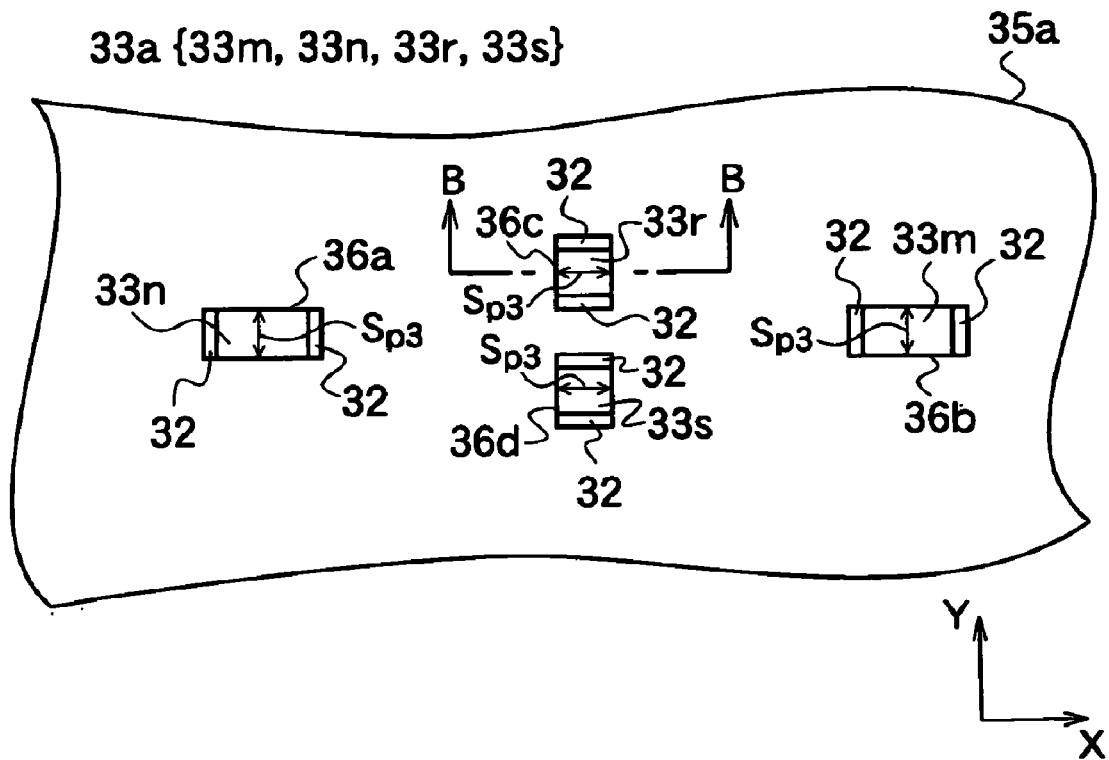
FIG. 16A is a plane view in process after process shown in FIG. 15 for explaining an example of a method for forming a pattern according to the first embodiment of the present invention.
Figure 16B:
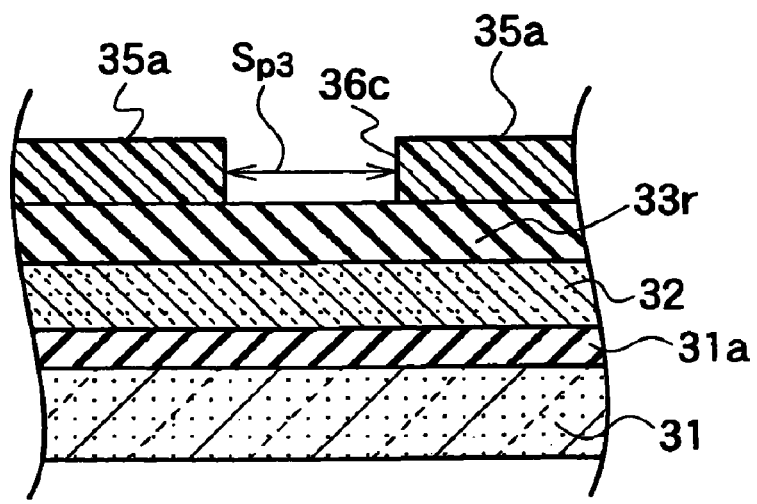
FIG. 16B is a sectional view at B-B shown in FIG. 16A.

(e) Next, as shown in FIG. 15, a second resist film 35 is spin-coated on the process-target film 32 and the underlying mask pattern 33a. Subsequently, the second mask 20 shown in FIG. 9A is mounted on the unillustrated projection exposure system, and then the pattern of the second mask 20 is reduced to, e.g., ⅕ (or ¼) and transferred onto the second resist film 35. Thereafter, the second resist film 35 is developed, and thus a second resist pattern 35a as shown in FIGS. 16A and 16B is delineated. The second resist pattern 35a has four rectangular window portions 36a, 36b, 36c, and 36d. The two window portions 36a and 36b have the same shapes and are separated from each other along a single line in the X-axis direction. The two window portions 36a and 36b expose parts of the connection portions 33n and 33m of the underlying mask pattern 33a, respectively, each by a length of a target space width $S_{p3}$ in the Y-axis direction. The target space width $S_{p3}$ may be the minimum space width $S_{min}$ with which a pattern can be optically resolved by a projection exposure system. The two window portions 36c and 36d, having the same shapes, are separated from each other along a single line in the Y-axis direction and provided line-symmetrically relative to a line connecting the two window portions 36a and 36b. The two window portions 36c and 36d expose parts of the thin line portions 33r and 33s of the underlying mask pattern 33a, respectively, each by a length of the target space width $S_{p3}$, in the X-axis direction. Further, part of the process-target film 32 is exposed at the interiors of the window portions 36a, 36b, 36c, and 36d.

Figure 17:
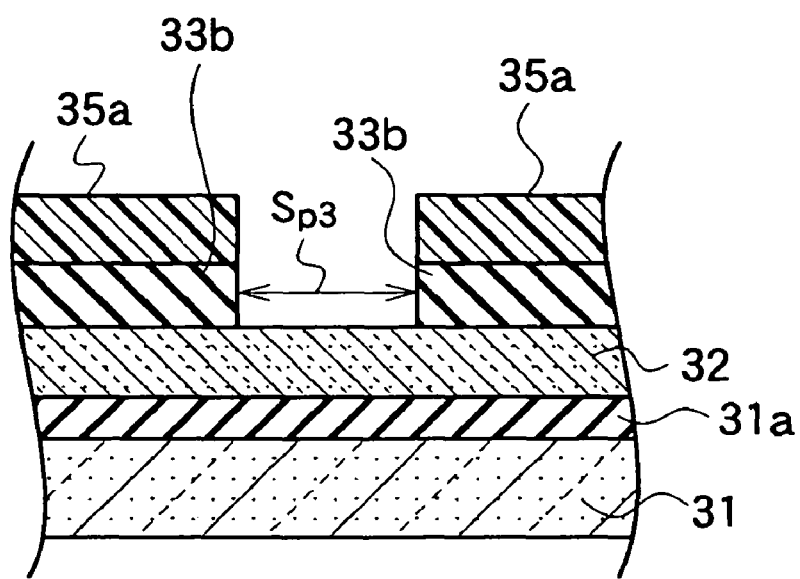
FIGS. 17 and 18 are sectional views in processes after process shown in FIG. 16B for explaining an example of a method for forming a pattern according to the first embodiment of the present invention.
Figure 18:
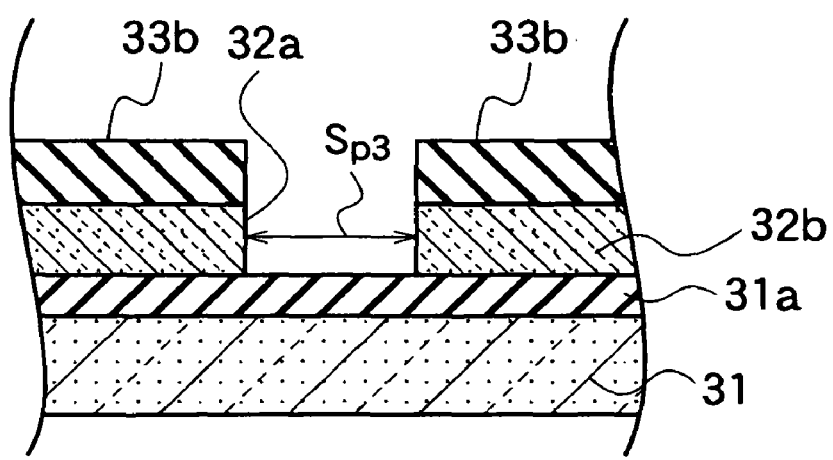

(f) Next, with the second resist pattern 35a as a mask, parts of the thin line portions 33r and 33s and connection portions 33m and 33n of the underlying mask pattern 33a are selectively removed by RIE or the like, thus dividing each portion into two portions. As a result, an underlying mask pattern (insulator pattern) 33b is delineated as shown in FIG. 17. The second resist pattern 35a is removed by use of a resist remover or the like. Thereafter, with the underlying mask pattern 33b as a mask, part of the process-target film 32 is selectively removed by RIE or the like. Consequently, four process-target film patterns (circuit patterns) 32a, 32b, 32c, and 32d as shown in FIG. 18 (where 32c, and 32d are not shown) are delineated. Thereafter, the remaining underlying mask pattern 33b is removed by use of hydrofluoric acid (HF) or the like. As shown in FIGS. 19A and 19B, the four process-target film patterns 32a, 32b, 32c, and 32d have the same shapes and positional relationships of line-symmetry (mirror symmetry) with one another. The four process-target film patterns 32a, 32b, 32c, and 32d include four stripe-shaped thin line portions 39a, 39b, 39c, and 39d, respectively, and rectangular portions 38a, 38b, 38c, and 38d, respectively, each of which has a substantially square shape and is connected with an outer end portion in the X-axis direction of the corresponding thin line portion 39a, 39b, 39c, or 39d. The two thin line portions 39a and 39c are separated from each other by the target space width $S_{p3}$ therebetween and arranged by the target line width $W_{p2}$ along a single line. The two thin line portions 39b and 39d are also separated from each other by the target space width $S_{p3}$ therebetween and arranged by the target line width $W_{p2}$ along a single line. The two thin line portions 39a and 39b are separated from each other in parallel, by the space width $S_{p2}$ therebetween in the Y-axis direction. Similarly, the two thin line portions 39c and 39d are separated from each other in parallel, by the space width $S_{p2}$ therebetween in the Y-axis direction. The rectangular portions 38a and 38b are separated by the target space width $S_{p3}$ therebetween in the Y-axis direction. The rectangular portions 38c, and 38d are separated by the target space width $S_{p3}$ therebetween in the Y-axis direction.

According to the first embodiment, it is possible to delineated the process-target film patterns (circuit patterns) 32a to 32d having both the target line width $W_{p2}$, which is smaller than the minimum line width $W_{min}$ with which a pattern can be optically resolved by a projection exposure system, and the target space width $S_{p3}$, which is the minimum space width $S_{min}$ with which a pattern can be optically resolved by a projection exposure system. It should be noted that the method for forming a pattern according to this embodiment is an example. The method is not limited to the procedure shown in FIGS. 11 to 19B, and other various procedures can be adopted.

Moreover, the target line width $W_{p2}$ does not need to be smaller than the minimum line width $W_{min}$. That is, the target line width $W_{p2}$ may be equal to, or may be larger than, the minimum line width $W_{min}$. When the target line width $W_{p2}$ is larger than the minimum line width $W_{min}$, it is possible to obtain an increased lithography margin corresponding to a difference quantity from the minimum line width $W_{min}$ and the resizing quantity $\Delta L_1$, for the line width of the first resist pattern.

Furthermore, the target space width $S_{p3}$ does not need to equal to the minimum space width $S_{min}$. That is, the target space width $S_{p3}$ may be larger than the minimum space width $S_{min}$. When the space width is larger than the minimum space width $S_{min}$, it is possible to obtain an increased lithography margin corresponding to a difference quantity from the minimum space width $S_{min}$ in the second resist pattern.

[First Modification]

Figure 20:
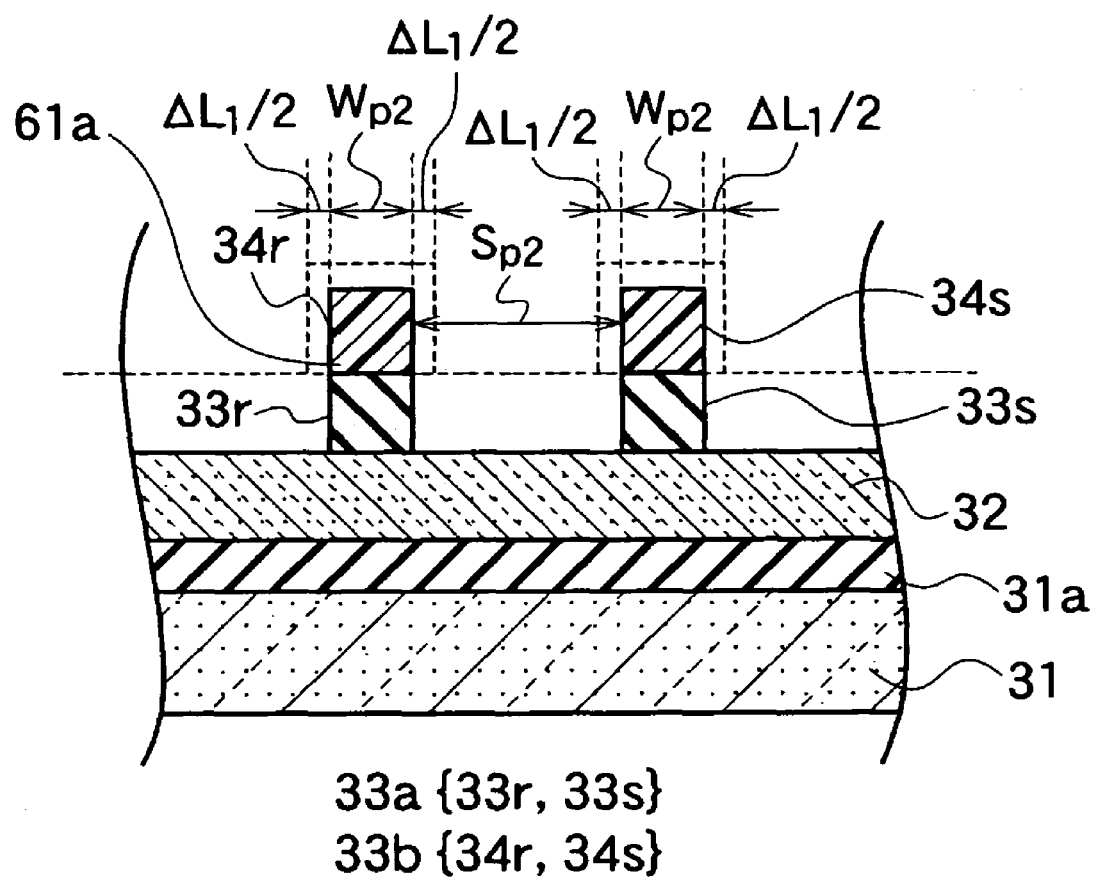
FIG. 20 is a sectional view for explaining an example of a method for forming a pattern according to a first modification of the first embodiment of the present invention.

In a method for forming a pattern according to a first modification of the first embodiment of the present invention, instead of the procedures shown in FIGS. 13A to 14, the following procedure is performed. As shown in FIG. 20, the first resist pattern 34a shown in FIGS. 12A and 12B is slimmed by etching such as RIE for a longer etching time than the just-etching time by the resizing quantity $\Delta L_1$ (=$\Delta D_1$), and at the same time, part of the underlying mask film 33 is selectively removed so that the residual part thereof has the line width $W_{p2}$ that is smaller than the minimum line width $W_{min}$ with which a pattern can be optically resolved by a projection exposure system. That is, the thin line portions 33r and 33s of the underlying mask pattern (insulator pattern) 33a, which has the same shape as that of the resized resist pattern 34b obtained by slimming the first resist pattern 34a, are delineated by over etching.

Note that the resized resist pattern 34b and the underlying mask pattern 33a do not need to be completely identical in shape. Such etching is allowable as to create an undercut portion where the underlying mask pattern 33a is thinner. In any case, in order to slim the underlying mask pattern 33a by over etching, an etching gas for use in RIE is selected so that the etching rate of the underlying mask film 33 is 10 to 1000 times, preferably 30 to 1000 times, more preferably 100 to 1000 times as high as the etching rate of the process-target film 32. Other procedures, which are similar to the procedures shown in FIGS. 11, 15 to 19B, are omitted.

According to the first modification of the first embodiment of the present invention, the same as in the first embodiment, it is also possible to delineate the process-target film patterns (circuit patterns) 32a to 32d having both the target line width $W_{p2}$, which is smaller than the minimum line width $W_{min}$ with which a pattern can be optically resolved by a projection exposure system, and the target space width $S_{p3}$, which is the minimum space width $S_{min}$ with which a pattern can be optically resolved by a projection exposure system, when the procedures shown in FIGS. 20A and 20B are adopted instead of the procedures shown in FIGS. 12A to 14.

[Second Modification]

Figure 21:
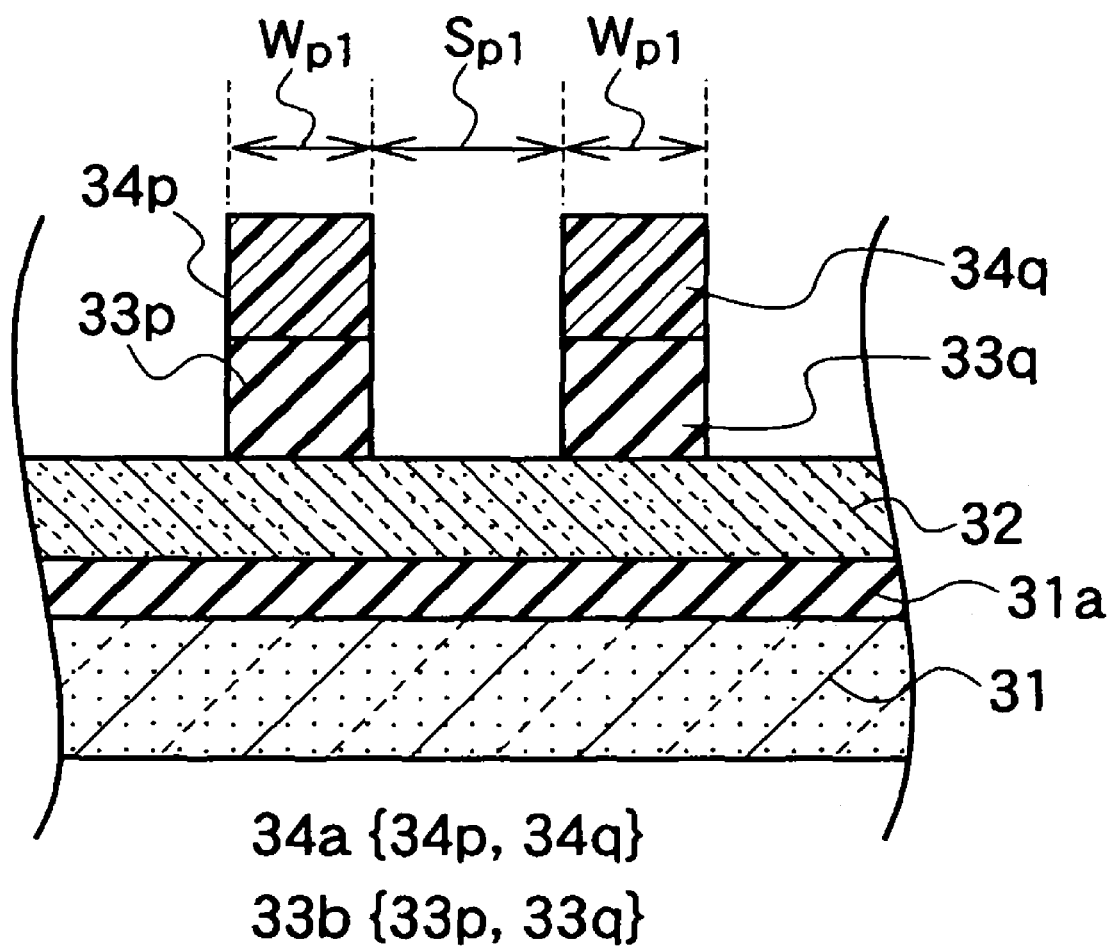
FIGS. 21 and 22 are sectional views for explaining an example of a method for forming a pattern according to a second modification of the first embodiment of the present invention.
Figure 22:
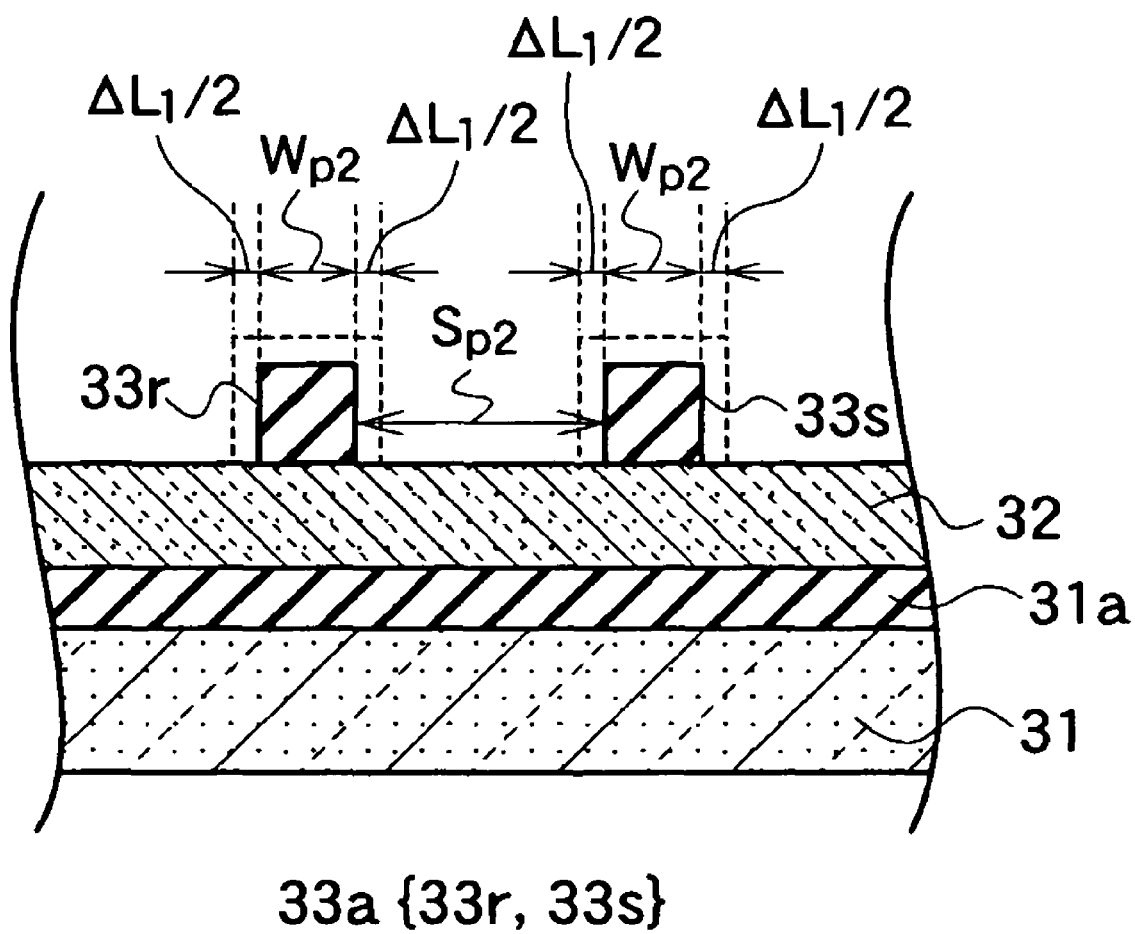

In a method for forming a pattern according to a second modification of the first embodiment of the present invention, instead of the procedures shown in FIGS. 13A to 14, the following procedures are performed. With the first resist pattern 34a shown in FIG. 12A as an etching mask, part of the underlying mask film 33 is selectively removed by RIE or the like. As a result, the underlying mask pattern (insulator pattern) 33a is delineated as shown in FIG. 21. The first resist pattern 34a is removed by use of a resist remover or the like. Thereafter, as shown in FIG. 22, the underlying mask film 33 is slightly etched by use of, when the underlying mask film 33 is an oxide film, an oxide etchant such as HF to slim the underlying mask pattern 33a by $\Delta L_1$ (=$\Delta D_1$), thus delineating the thin line portions 33r and 33s of the underlying mask pattern 33a. Needless to say, in terms of controllability, it is preferable to slightly etch the underlying mask film 33, not by wet etching but by dry etching. Other procedures, which are the same as the procedures shown in FIGS. 11 to 12B, and 15 to 19B, are omitted.

According to the second modification of the first embodiment of the present invention, the same as the first embodiment, it is possible to obtain the process-target film patterns (circuit patterns) 32a to 32d, having both the target line width $W_{p2}$, which is smaller than the minimum line width $W_{min}$ with which a pattern can be optically resolved by a projection exposure system, and the target space width $S_{p3}$, which is system the minimum space width $S_{min}$ with which a pattern can be optically resolved by a projection exposure system, when the procedures shown in FIGS. 21 and 22 are adopted instead of the procedures shown in FIGS. 13A to 14.

Second Embodiment

Figure 23:
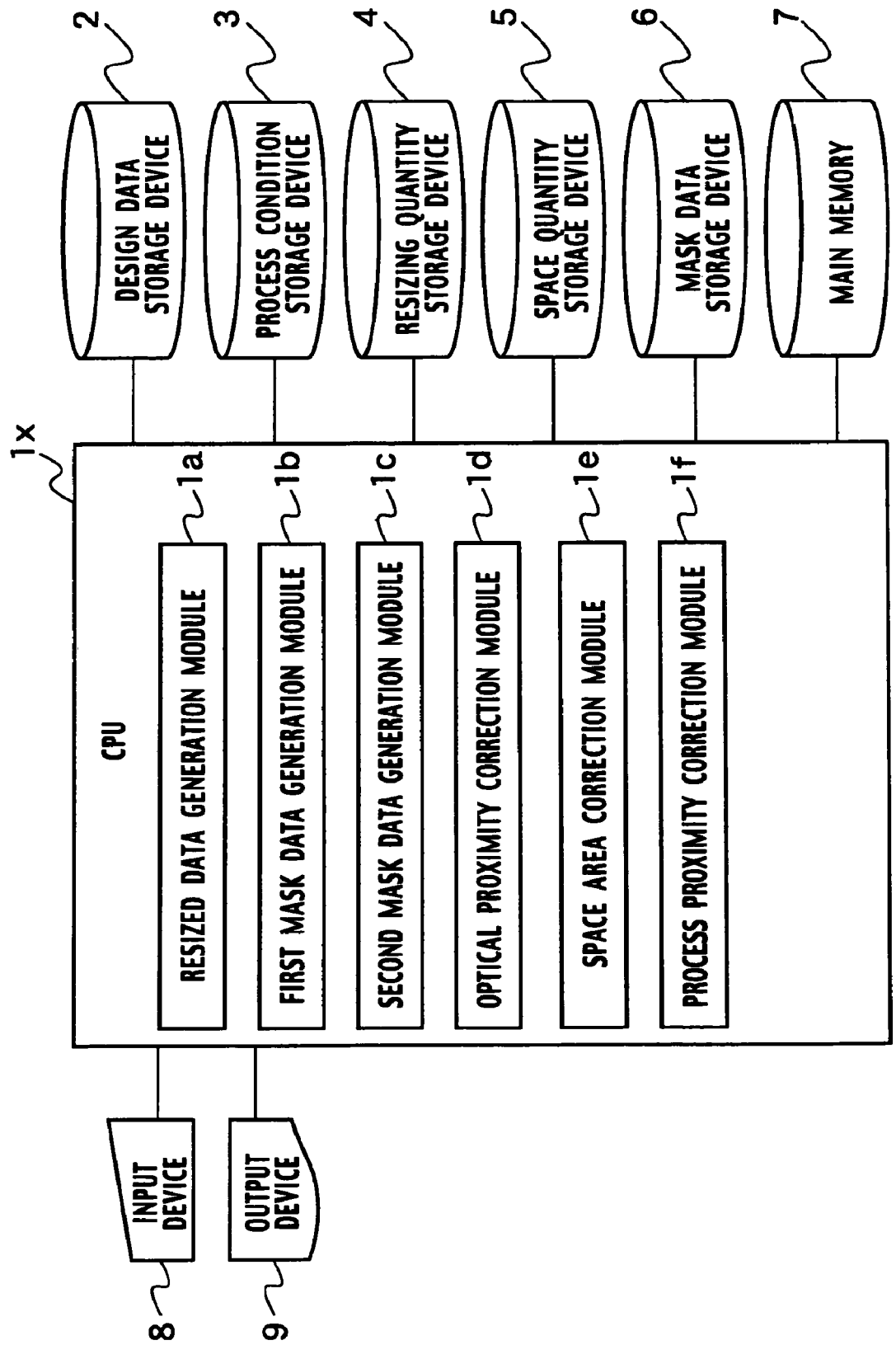
FIG. 23 is a block diagram showing an example of mask data generation system according to a second embodiment of the present invention.

As shown in FIG. 23, a mask data generation system according to the second embodiment of the present invention includes a central processing unit (CPU) 1x, a design data storage device 2, a process condition storage device 3, a resizing quantity storage device 4, a space quantity storage device 5, a mask data storage device 6, a main memory 7, an input device 8, and an output device 9.

Figure 24:
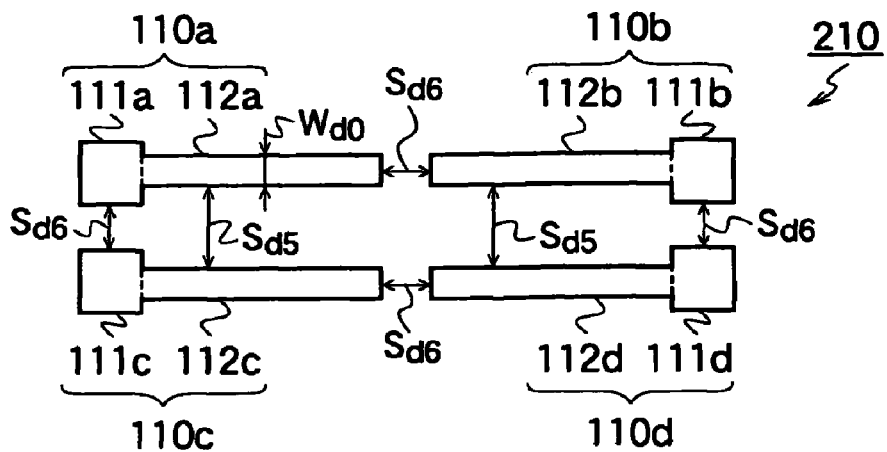
FIG. 24 is a schematic view showing an example of design data according to the second embodiment of the present invention.

The design data storage device 2 stores design data 210 shown in FIG. 24 instead of the design data 110 shown in FIG. 2. The design data 210 includes four design patterns 110a, 110b, 110c, and 110d for forming desired process-target film patterns on a semiconductor substrate, the same as design data 110. The design patterns 110a, 110b, 110c, and 110d all have a line symmetrical (mirror symmetrical) relationship and have the same shape with one another. The two thin line portion 112a and 112b are separated from each other by the space width $S_{d6}$ therebetween in the X-axis direction. The two thin line portion 112c and 112d are also separated from each other by the space width $S_{d6}$ therebetween in the X-axis direction. The two rectangular portions 111a and 111c are also separated from each other by the space width $S_{d6}$ therebetween in the Y-axis direction. The two rectangular portions 111b and 111d are also separated from each other by the space width $S_{d6}$ therebetween in the Y-axis direction.

Here, the space width $S_{d6}$ is different from the space width $S_{d0}$ shown in FIG. 2 in that the space width $S_{d6}$ may be smaller than the minimum space width $S_{min}$ with which a pattern can be optically resolved by a projection exposure system. The space width $S_{d6}$ is determined based on a space width reducing quantity $\Delta D_2$ by a process such an on overcoat method or a thermal flow process (TF process) for reducing the space width after exposure processes. The two thin line portions 112a and 112c are separated from each other by the space width $S_{d5}$ therebetween in the Y-axis direction. The two thin line portions 112d and 112b are also separated from each other by the space width $S_{d5}$ therebetween in the Y-axis direction.

The process condition storage device 3 shown in FIG. 23 further stores a space width reducing quantity $\Delta D_2$ by process for reducing the space width after exposure processes. The process condition storage device 3 further stores a process proximity effect quantity such as a change quantity of the space width reducing quantity $\Delta D_2$ generated by conditions of surrounding patterns in processes for slimming the space width after exposure processes.

The CPU 1x is different from the CPU 1 shown in FIG. 1 in that the CPU 1x further includes a space area correction module 1e and a process proximity correction module if in addition to the resized data generation module 1a, the first mask data generation module 1b, the second mask data generation module 1c, and the OPC module 1d.

Figure 25:
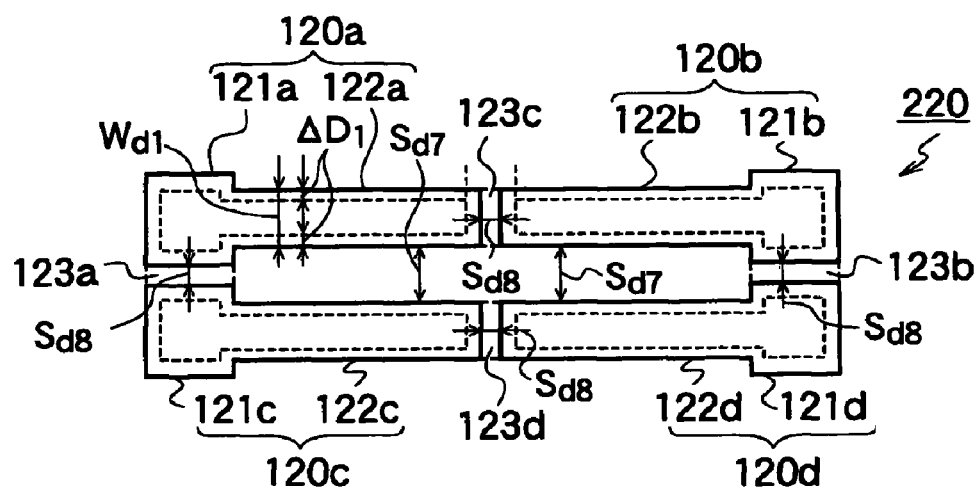
FIG. 25 is a schematic view showing an example of a resized data according to the second embodiment of the present invention.

The resized data generation module 1a generates, for example, as shown in FIG. 25, resized data 220 having resized patterns 120a, 120b, 120c, and 120d by equally enlarging the design patterns 110a, 110b, 110c, and 110d shown in FIG. 24 by the resizing quantity $\Delta D_1$. The space width $S_{d8}$, from which each of the two thin line portions 122a and 122b, the two thin line portions 122c and 122d, the two rectangular portions 121a and 121c, and the two rectangular portions 121b and 121d are respectively separated, is smaller than the minimum space width $S_{min}$ with which a pattern can be optically resolved by a projection exposure system. Moreover, each of the two thin line portions 122a and 122c, and the two thin line portions 122b and 122d are separated from each other by the space width $S_{d7}$ in the Y-axis direction.

Figure 26:
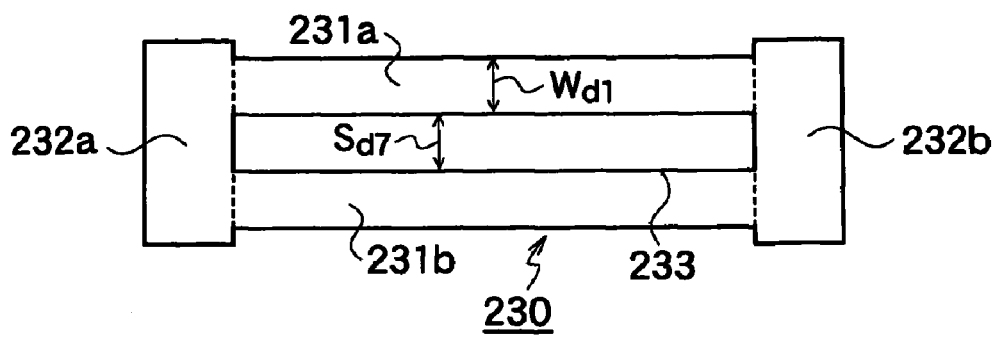
FIG. 26 is a schematic view is a schematic view showing an example of first mask data according to the second embodiment of the present invention.

As shown in FIG. 26, the first mask data generation module 1b shown in FIG. 23, for example, generates first mask data 230 by filling the space areas 123a, 123b, 123c, and 123d, having a space width $S_{d8}$ which is the space quantity ΔS or less, in the resized data 120 shown in FIG. 25. The first mask data 230 includes two thin line patterns 231a and 231b, and a pair of thin line patterns 232a and 232b which connect with each other and which sandwich both ends of the two thin line patterns 131a and 131b.

Figure 27:
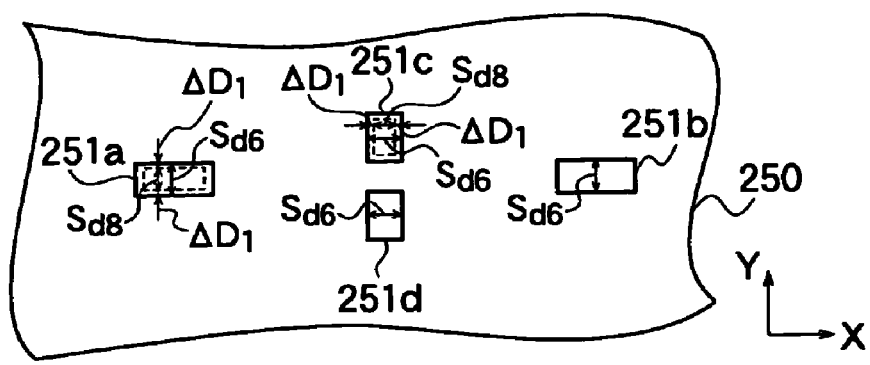
FIG. 27 is a schematic view showing an example of second mask data according to the second embodiment of the present invention.

As shown in FIG. 27, the second mask data generation module 1c shown in FIG. 23 generates second mask data 250 having four window portions 251a, 251b, 251c, and 251d by enlarging the space areas 123a, 123b, 123c, and 123d of the resized data 120 shown in FIG. 25 by the resizing quantity $\Delta D_1$. The second mask data 250 is a data of patterns, which can be aligned with the first mask data 230. The four window portions 251a, 251b, 251c, and 251d are patterns for exposing portions of the thin line patterns 232a, 232b, 231a and 231b shown in FIG. 25 having the space width $S_{d6}$, at the positions of the space areas 123a, 123b, 123c, 124d.

The space area correction module 1e shown in FIG. 23 reads process conditions stored in the process condition storage device 3 and estimates the space width reducing quantity $\Delta D_2$ for reducing a space width of patterns corresponding to the window portions 251a, 251b, 251c, and 251d on a semiconductor substrate after exposure processes. The space area correction module 1e then reads the second mask data generated by the second mask data generation module 1c and enlarges the respective window portions of the second mask data by the estimated space width reducing quantity $\Delta D_2$. Note that the space area correction module 1e may reads the space width reducing quantity $\Delta D_2$ which is predetermined stored in the process condition storage device 3.

Figure 29A:
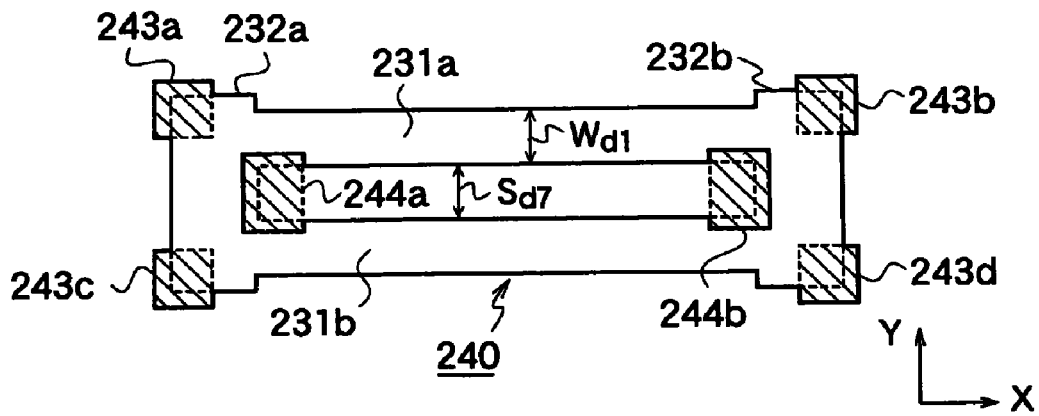
FIG. 29A is a schematic view showing an example of first mask data on which optical proximity correction is performed according to the second embodiment of the present invention.

For example, the space area correction module 1e enlarges the window portions 251a, 251b, 251c, and 251d of the second mask data 250 shown in FIG. 27 by the space width reducing quantity $\Delta D_2$. Consequently, as shown in FIG. 29A, the second mask data 260, which includes window portions 261a and 261b having a side by the space width $S_{d9}$ in Y-axis direction and window portions 261c and 261d having by the space width $S_{d9}$ in the X-axis direction, is generated. Here, the space width $S_{d9}$ is a dimension with which a pattern can be optically resolved by a projection exposure system. That is, the space width $S_{d6}$ of the design data 210 is determined so as to be larger than a half value of a dimension subtracted the space width reducing quantity $\Delta D_2$ from the minimum space width $S_{min}$ with which a pattern can be optically resolved by a projection exposure system.

For example, the OPC module 1d shown in FIG. 23 performs OPC on the first mask data 230 shown in FIG. 26. Consequently, as shown in FIG. 29A, rectangular positive OPC patterns 243a to 243d and rectangular negative patterns 244a and 244b are added. The positive OPC patterns 243a to 243d are partially superimposed on four corners of the thin line patterns 232a and 232b. Moreover, the negative patterns 244a and 244b are partially superimposed on the two thin line patterns 231a and 231b and the thin line patterns 232a and 232b in a C-shape, in vicinities of both ends of the window portions 233 in the X-axis direction.

Figure 28:
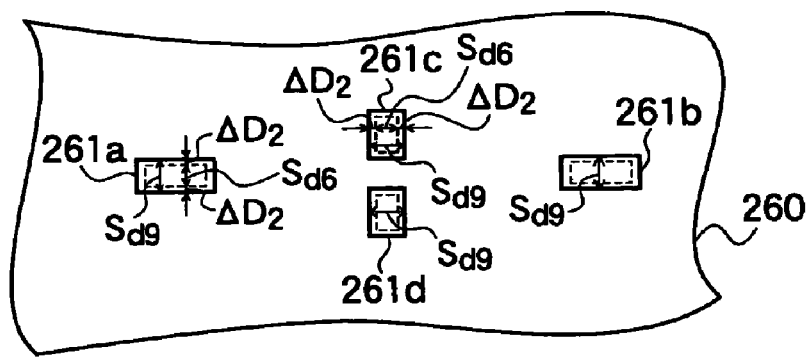
FIG. 28 is a schematic view showing an example of second mask data having a window portion is enlarged according to the second embodiment of the present invention.
Figure 29B:
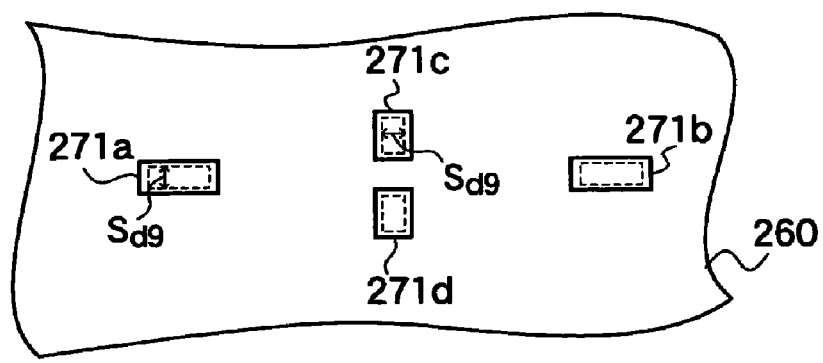
FIG. 29B is a schematic view showing an example of second mask data on which optical proximity correction is performed according to the second embodiment of the present invention.

Furthermore, the OPC module 11d shown in FIG. 23 performs OPC on the second mask data having the window portions enlarged by the space area correction module 1e. For example, as shown in FIG. 29B, the OPC module 11d adds negative patterns 271a and 271b so as to cover the window portions 261a and 261b and negative patterns 271c and 271d so as to cover the window portions 261c and 261d, by performing OPC on the second mask data 260 shown in FIG. 28.

The process proximity correction module 1f shown in FIG. 23 reads a process proximity correction quantity stored in the process condition storage device 3, and estimates process proximity effects when patterns are delineated. The process proximity correction module 1f then performs process proximity correction on the first mask data 240 and the second mask data 270 respectively. It is possible to prevent process proximity effects in processes for slimming the space width.

Next, a description will be given of an example of a method of generating mask data according to the second embodiment of the present invention, referring to a flowchart of FIG. 30.

(a) In step S1 of FIG. 30, as shown in FIG. 24, design data 210 is prepared. The design data 210 includes, the same as the design data 110, four design patterns 110a, 110b, 110c, and 110d for forming desired process-target film patterns on a semiconductor substrate, and have a line symmetrical (mirror symmetrical) relationship with one another. In step S2, as shown in FIG. 25, the resized data generation module 1a shown in FIG. 23 generates resized data 220 having resized patterns 120a, 120b, 120c, and 120d by equally enlarging the design patterns 110a, 110b, 110c, and 110d shown in FIG. 24 by the resizing quantity $\Delta D_1$.

(b) In step S3, the first mask data generation module 1b shown in FIG. 23 generates first mask data 230 shown in FIG. 26 by filling the space areas 123a, 123b, 123c, and 123d having the space width $S_{d8}$, which is the space quantity ΔS or less, sandwiched at two sides of the thin line portions 122a, 122b, 122c, and 122d in the resized data 120 shown in FIG. 25. In step S4, as shown in FIG. 27, the second mask data generation module 1c shown in FIG. 23 generates second mask data 250 having four window portions 251a, 251b, 251c, and 251d by enlarging the space areas 123a, 123b, 123c, and 123d of the resized data 220 shown in FIG. 25 by the resizing quantity $\Delta D_1$. The window portions 251a, 251b, 251c, and 251d expose parts of the thin line patterns 231a, 231b, 232a and 232b having the space width $S_{d6}$, at the positions of the space areas 123a, 123b, 123c, and 123d.

(c) In step S4x, the space area correction module 1e shown in FIG. 23 reads the second mask data 250 generated in step S4, and a space width reducing quantity $\Delta D_2$ stored in the process condition storage device 3. The space area correction module 1e then generates second mask data 260 by enlarging the window portions 251a, 251b, 251c, and 251d of the second mask data 250 by the space width reducing quantity $\Delta D_2$ as shown in FIG. 28. The second mask data 260 includes the window portions 261a and 261b having one side by the space width $S_{d9}$ in the Y-axis direction and the window portions 261c and 261d having one side by the space width $S_{d9}$ in the X-axis direction.

(d) In step S5, the OPC module 14d shown in FIG. 23 performs OPC on the first mask data 230 shown in FIG. 26. Consequently, as shown in FIG. 29A, rectangular positive OPC patterns 243a to 243d and rectangular negative patterns 244a and 244b are added. Furthermore, the OPC module 14d shown in FIG. 23 performs OPC on the second mask data 260 shown in FIG. 28. Consequently, as shown in FIG. 29B, negative OPC patterns 271a, 271b, 271c, and 271d, which cover the window portions 261a, 261b, 261c, and 261d, are added.

(e) In step S5x, the process proximity correction module 1f shown in FIG. 23 reads process condition stored in the process condition storage device 3, and estimates process proximity effects in process for reducing the space width when patterns are formed. The process proximity correction module if then performs process proximity correction on each of the first mask data 240 and the second mask data 270. The first mask data 240 and the second mask data 270 on which process proximity corrections have been performed are stored in the mask data storage device 6.

(f) In step S6, the first mask data 240 and the second mask data 27 are converted to data for a pattern generator such an EB writing device respectively. Then, a fit mask 40 shown in FIG. 31 and a second mask 50 shown in FIG. 32 are produced with the pattern generator, based on the converted first mask data 240 and the converted second mask data 270.

According to a method of generating mask data according to the second embodiment of the present invention, it is possible to provide a set of mask which can delineate circle patterns having both a target line width, which is smaller than the minimum line width $W_{min}$ with which a pattern can be optically resolved by a projection exposure system, and the target space width, which is the minimum space width $S_{min}$ with which a pattern can be optically resolved by a projection exposure system. Note that, the method of generating mask data according to the second embodiment the present invention is an example, ant the method is not limited to step S1 to S6, and the method can be used with other various process.

Moreover, the line width $W_{d0}$ of the design data 210 does not need to be smaller than the minimum line width $W_{min}$. That is, the line width $W_{d0}$ may be equal to, or may be larger than, the minimum line width $W_{min}$. When the line width $W_{d0}$ is larger than the minimum line width $W_{min}$, it is possible to obtain an increased lithography margin corresponding to a difference quantity from the minimum line width $W_{min}$ and the resizing quantity $\Delta D_1$.

Furthermore, the space width $S_{d6}$ does not need to be smaller than the minimum space width $S_{min}$. That is, the space width $S_{d6}$ may be equal to, or may be larger than, the minimum space width $S_{min}$. When the space width $S_{d6}$ is larger than the minimum space width $S_{min}$, it is possible to obtain an increased lithography margin corresponding to a difference quantity from the minimum space width $S_{min}$, and the space width reducing quantity $\Delta D_2$.

Figure 31:
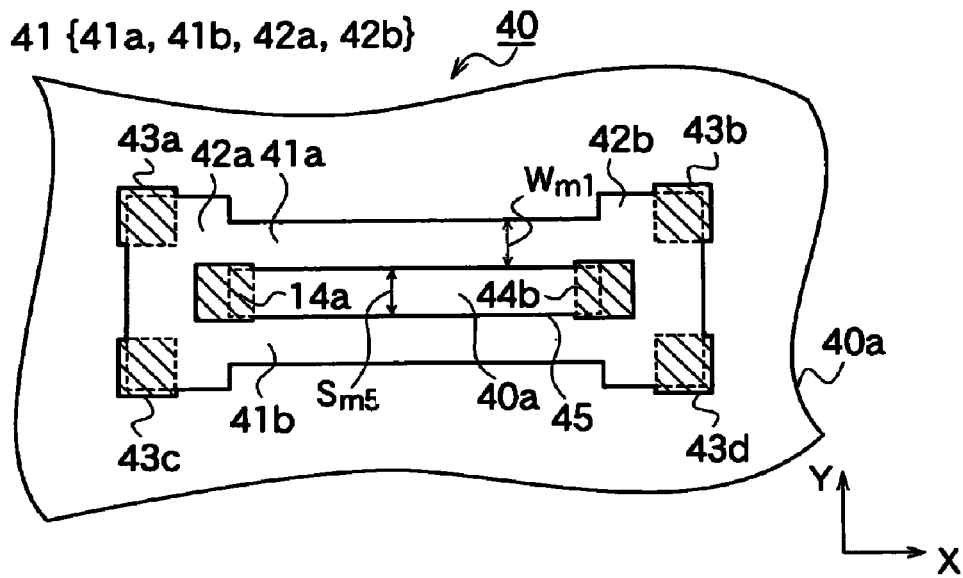
FIG. 31 is a plane view showing an example of a first mask of a set of masks according to the second embodiment of the present invention.
Figure 32:
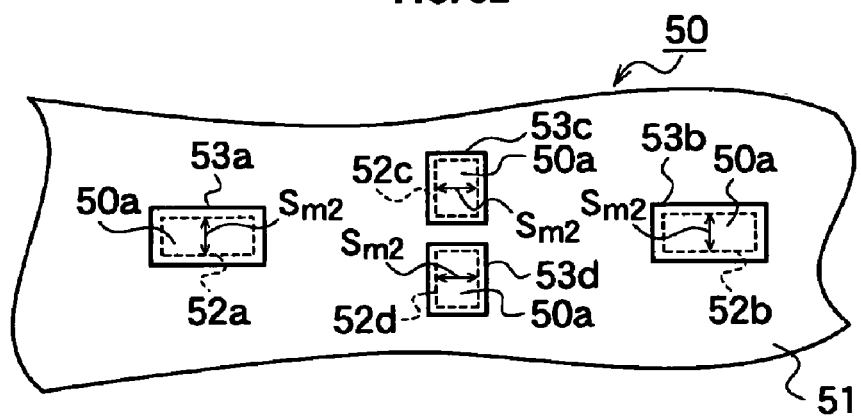
FIG. 32 is a plane view showing an example of a second mask of the set of masks according to the second embodiment of the present invention.

As shown in FIGS. 31 and 32, the set of masks according to the second embodiment of the present invention is a set of photomasks for forming, on a semiconductor substrate, thin line portions having a line width smaller than the minimum line width $W_{min}$ with which a pattern can be optically resolved by a projection exposure system, by slimming the line width of patterns after exposure by a predetermined quantity. The set of masks includes a first mask 40 having thin line patterns 41a and 41b for forming the thin line portion, and a second mask 50 having the window portions 52a, 52b, 52c, and 52d for removing unnecessary parts from the patterns formed by use of the first mask 40.

As shown in FIG. 31, the first mask 40 includes a first mask plate 40a, and a first mask pattern 41 placed on the first mask plate 40a. The first mask pattern 41 includes the two stripe-shaped thin line patterns 41a and 41b, and a pair of connection patterns 42a and 42b which sandwich a both ends of the two thin line pattern 41a and 41b and are connected with each other. The two thin line pattern 41a, 41b are separated from each other in parallel by the line width $W_{m1}$ therebetween in the X-axis direction.

A window portion 45 surrounded by the two thin line pattern 41a and 41b and the pair of the connection patterns 42a and 42b exposes the first mask plate 40a. Rectangular positive OPC patterns 43a to 43d are placed respectively at four outer corners of the pair of the connection patterns 42a and 42b. Rectangular negative patterns 44a and 44b are placed at both ends of the window portions 45 in the X-axis direction. The positive OPC patterns 43a to 43d, and the negative OPC patterns 44a and 44b are added for preventing optical proximity effects in the exposing process.

The second mask 50 shown in FIG. 32 includes a second mask plate 50a and a second mask pattern 51 placed on the second mask plate 50a. The second mask pattern 51 includes the four rectangular window portions 52a, 52b, 52c, and 52d. The window portions 52a and 52b are separated from each other along a single line in the Y-axis direction. The two window portions 52c and 52d are separated from each other along a single line in the X-axis direction, and have line symmetrically relative to a line connecting the two window portions 52a and 52b. Here, the two window portions 52a and 52b are separated from each other by the space width $S_{m2}$ therebetween in the X-axis direction. The two window portions 52c and 52d are separated from each other by the space width $S_{m2}$ therebetween in the Y-axis direction. In the second mask pattern 51, four rectangular negative patterns 53a to 53d are further placed. The negative patterns 53a and 53b have respective one side in Y-axis direction, which is longer than the space width $S_{m5}$, so as to cover the two window portions 52a and 52b respectively. The negative patterns 53c and 53d have a respective one side in the X-axis direction which is longer than the space width $S_{m2}$ so as to cover the two window portions 52c and 52d.

Figure 33:
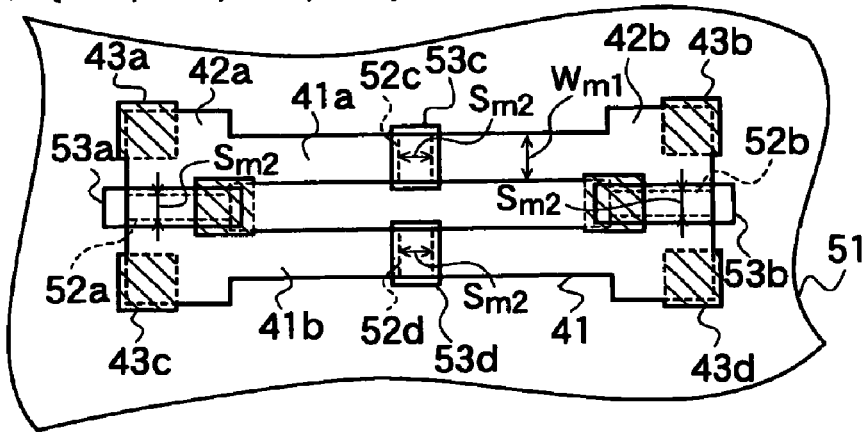
FIG. 33 is a plane view for explaining alignment between a first mask pattern and a second mask pattern of the set of mask according to the second embodiment of the present invention.

As shown in FIG. 33, the first mask pattern 41 shown in FIG. 31 and the second mask pattern 51 shown in FIG. 32 can be aligned each other. The window portions 52a and 52b can be aligned with the center of the respective connection patterns 42a and 42b with the space width $S_{m2}$ in the Y-axis direction. That is, the window portions 52a and 52b are patterns for dividing the connection patterns 42a and 42b by the target space width. Furthermore, the window portions 52c, 52d can be aligned with the center of the respective thin line patterns 41a and 41b by the space width $S_{m2}$ in the X-axis direction. That is, the window portions 52c and 52d are patterns for dividing strips on a semiconductor substrate with the target space width. Since other parts of the first mask 40 and the second mask 50 are substantially the same as the first mask 10 and the second mask 20 shown in FIGS. 8A to 10, repeated description is omitted.

According to set of masks of the second embodiment of the present invention, circuit patterns having both a target line width which is smaller than the minimum line width $W_{min}$ with which a pattern can be optically resolved by a projection exposure system, and the target space width which is smaller than the minimum space width $S_{min}$ with which a pattern can be optically resolved by a projection exposure system.

Next, a description will be given of an example of a method for forming a pattern according to the second embodiment of the present invention, referring to FIG. 11, and FIGS. 34A to 43B.

Figure 34A:
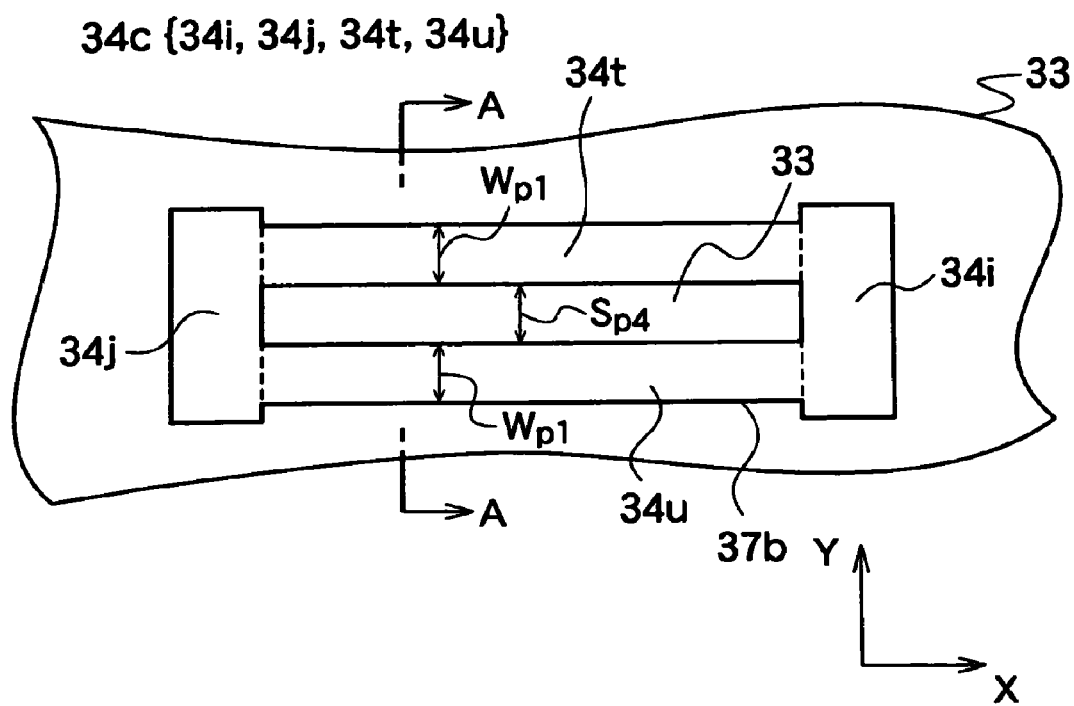
FIG. 34A is a plane view for explaining an example of a method for forming a pattern according to the second embodiment of the present invention.
Figure 34B:
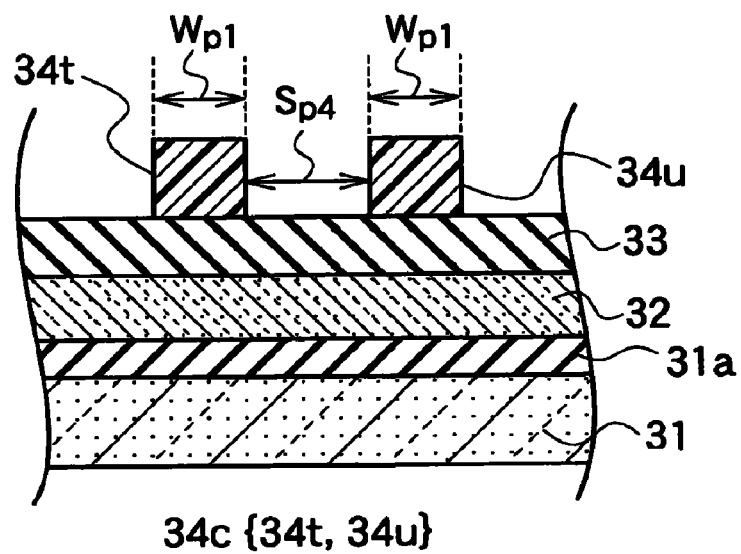
FIG. 34B is a sectional view at A-A shown in FIG. 34A.

(a) First, as shown in FIG. 11, a gate oxide film (first insulator) 31a, a process-target film 32 made of polycrystalline silicon or the like, and an underlying mask film (the second insulator) 33 made of silicon nitride ($Si_xN_y$) or the like are deposited on the semiconductor substrate 31 respectively by CVD or the like. Then, a first resist film 34 is spin-coated on the second insulator 33. Thereafter, the first mask 40 shown in FIG. 31 is mounted on an unillustrated projection exposure system, and then the pattern of the first mask 40 is reduced, and transferred onto the first resist film 34. Then, the first resist film 34 is developed. Thus, a first resist pattern 34c is delineated as shown in FIGS. 34A and 34B. The first resist pattern 34c includes two thin line portions 34t and 34u and a pair of connection portions 34i and 34j which sandwich the two thin line portions 34t and 34u at both ends thereof and connect the two thin line portions 34t and 34u with each other. The two thin line portions 34t and 34u are separated from each other by the space width $S_{p4}$ therebetween in the Y-axis direction and arranged in parallel by the line width $W_{p1}$ therebetween in the X-axis direction. The interior of the window portions 37b surrounded by the two thin line portion 34t and 34u and the pair of connection portions 34i and 34j exposes the underlying mask film 33.

Figure 35A:
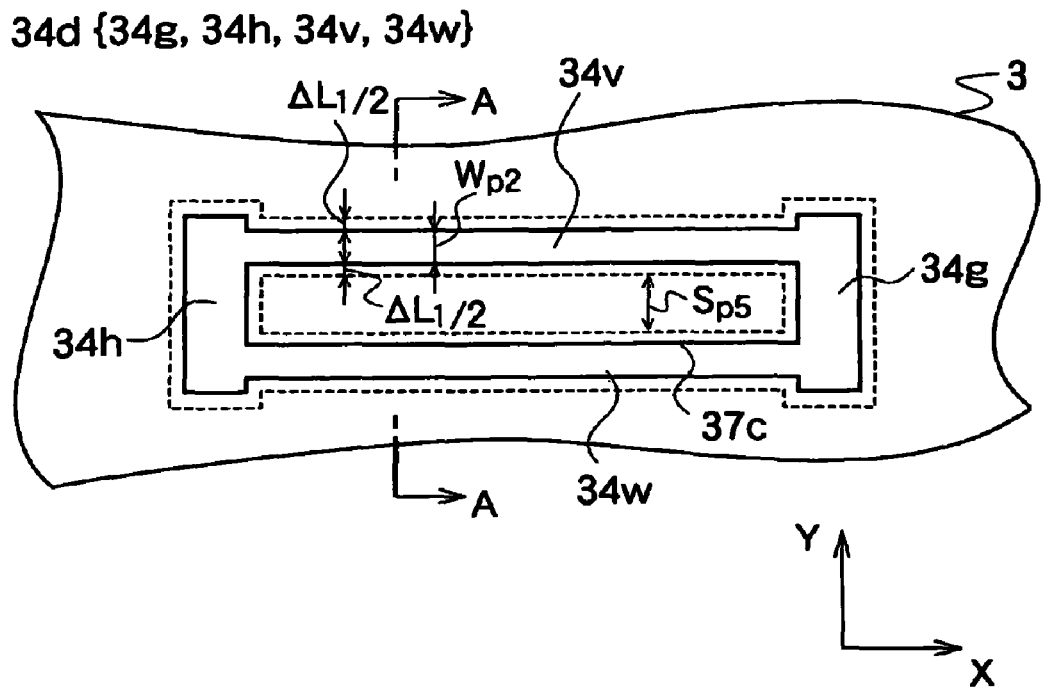
FIG. 35A is a plane view in process after process shown in FIG. 34A for explaining an example of a method for forming a pattern according to the first embodiment of the present invention.
Figure 35B:
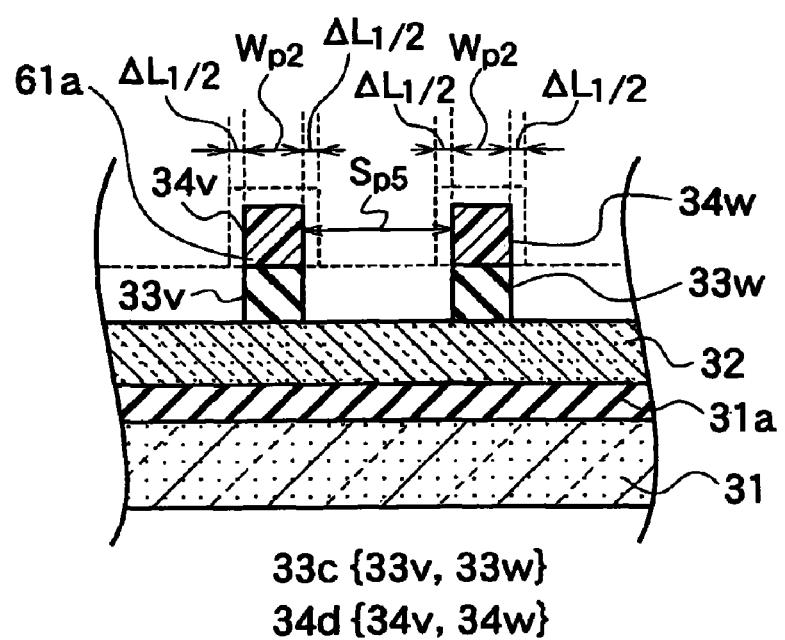
FIG. 35B is a sectional view at A-A shown in FIG. 35A.

(b) Next, as shown in FIGS. 35A and 35B, the first resist pattern 34c is slimmed by the resizing quantity $\Delta L_1$ ($=\Delta D_1$), by over etching such as by RIE for a time which is longer than a just-etching time. At the same time, parts of the underlying mask film 33 are selectively removed so as to be have the line width $W_{p2}$ which is smaller than the minimum line width $W_{min}$ with which a pattern can be optically resolved by a projection exposure system. That is, thin line portions 33v and 33w of the underlying mask pattern (isolation patterns) 33c, which first resist pattern 34c is slimmed, having the same shapes with the resized resist pattern 34d are delineated by the over etching. The resized resist pattern 34d includes the two thin line portions 34v and 34w, and the pair of connection portions 34g and 34h which sandwich the two thin line portions 34v and 34w at both ends thereof. The two thin line portions 34v and 34w are separated from each other by the space width $S_{p5}$ therebetween in the Y-axis direction and arranged in parallel by the line width $W_{p2}$ which is smaller than the minimum line width $W_{min}$ with which a pattern can be optically resolved by a projection exposure system in the X-axis direction. The interior of the window portion 37c surrounded by the two thin line portions 34v and 34w and the pair of the connection portions 34g and 34h exposes the underlying mask film 33. The resized resist pattern 34d is removed, using a resist remover.

Figure 36:
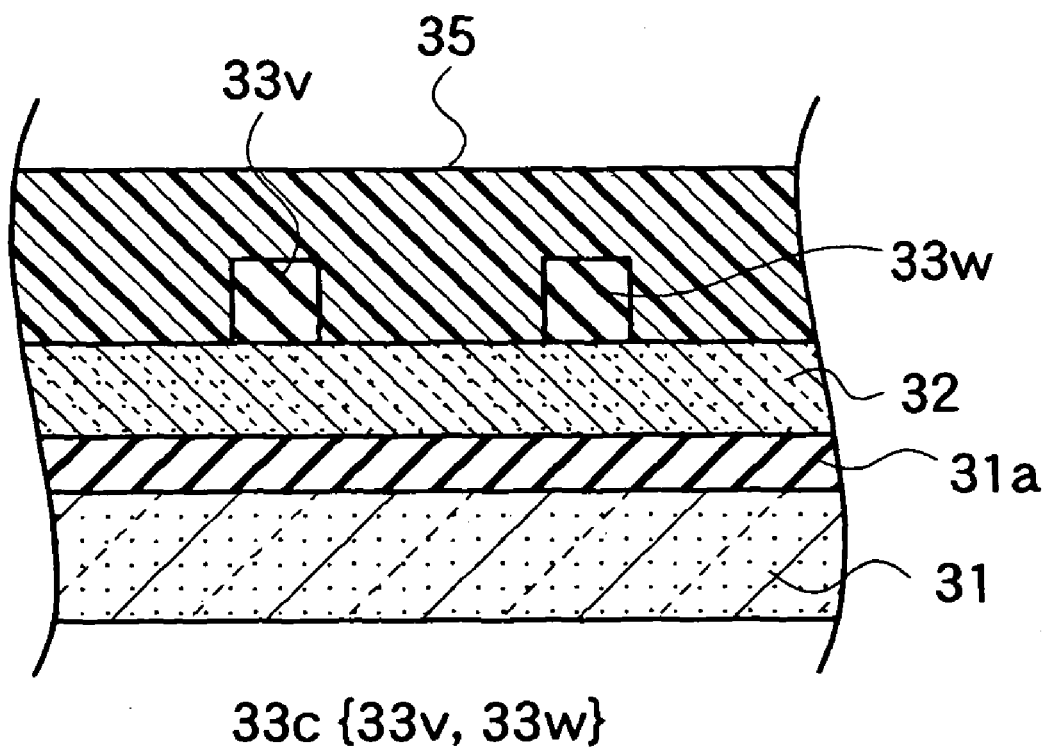
FIG. 36 is sectional view in process after process shown in of FIG. 35B for explaining an example of a method for forming a pattern according to the second embodiment of the present invention.
Figure 37A:
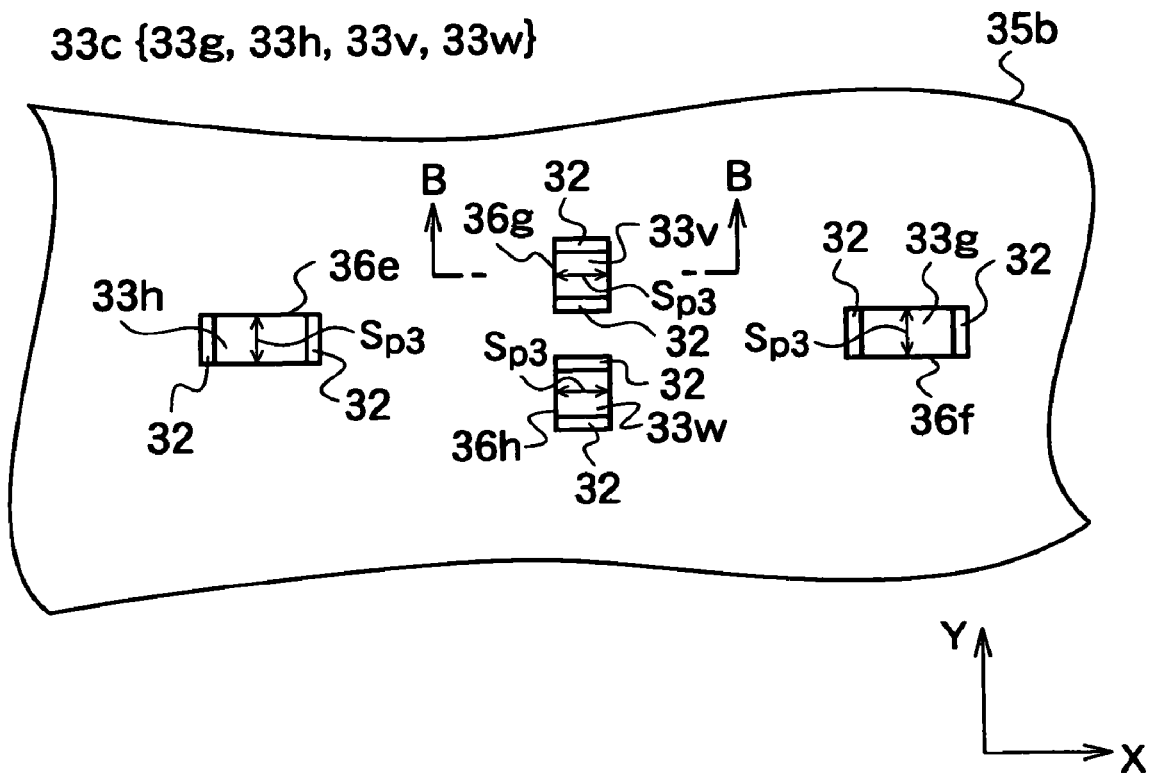
FIG. 37A is a plane view in process after process shown in of FIG. 36 for explaining an example of a method for forming a pattern according to the second embodiment of the present invention.
Figure 37B:
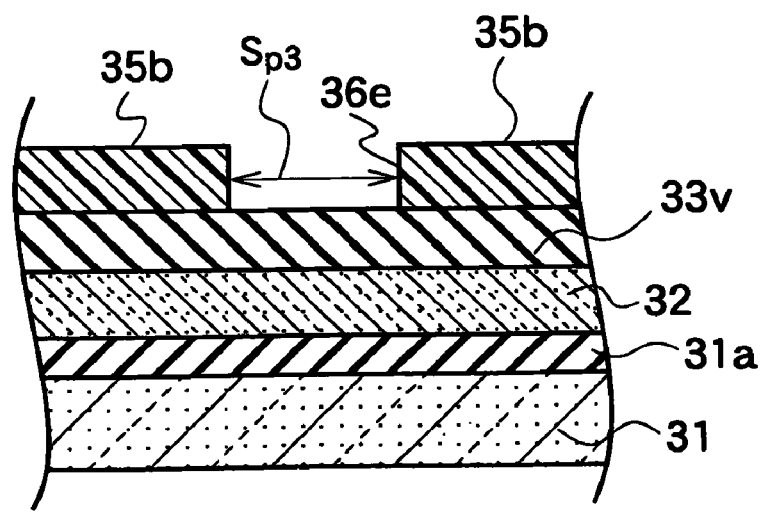
FIG. 37B is a sectional view at B-B shown in FIG. 37A.

(c) Next, as shown in FIG. 36, second resist film 35 is spin-coated on the underlying mask pattern 33c, and the exposed process-target film 32. Thereafter, the second mask 50 shown in FIG. 32 is mounted on an unillustrated projection exposure system, and the pattern of the second mask 50 is reduced, and transferred onto the second resist film 35. Then, as shown in FIGS. 37A and 37B, a second resist pattern 35b having four rectangular window portions 36e, 36f, 36g, and 36h is delineated by developing the second resist film 35. The two rectangular window portions 36e and 36f are separated from each other along a single line in the X-axis direction. The two window portions 36e and 36f have the same shapes as each other, and expose connection portions 33g and 33h having the length of the space width $S_{p3}$ of connection portions 33g and 33h of the underlying mask pattern 33c. The two rectangular window portions 36g and 36h are separated from each other along a single line in the Y-axis direction are line symmetrical relative to a line connecting the two window portions 36e and 36f. The two window portions 36g and 36h are also have the same shapes as one another, and expose parts having the space width $S_{p3}$ of the thin line portions 33v and 33w of the underlying mask patterns 33a respectively.

Figure 38:
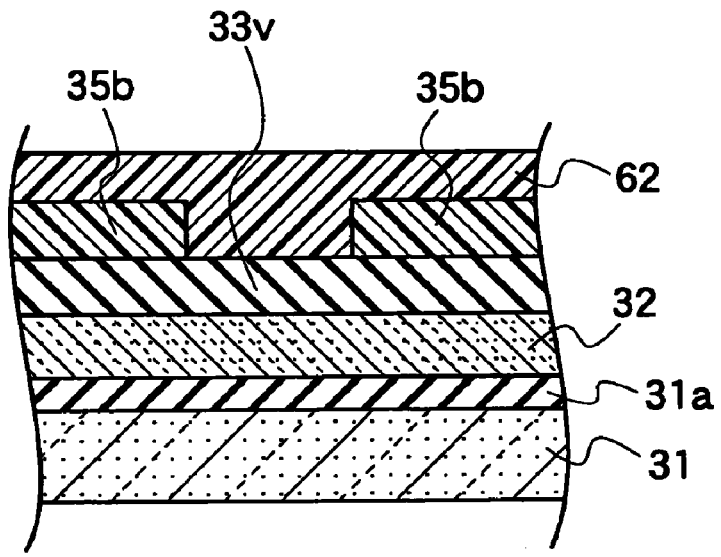
FIGS. 38 and 39 are sectional views in processes after process shown in of FIG. 37B for explaining an example of a method for forming a pattern according to the second embodiment of the present invention.
Figure 39:
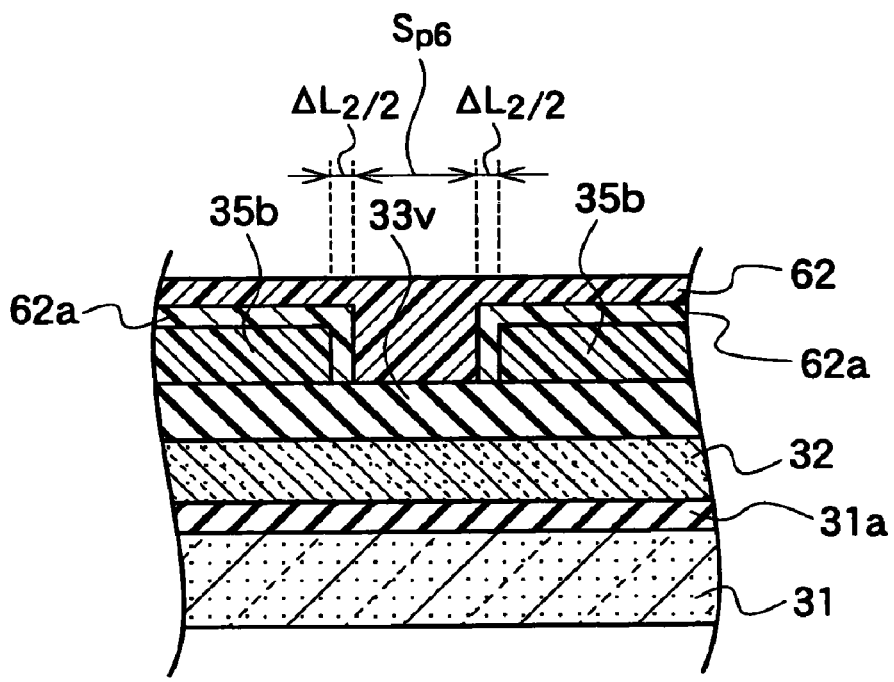
Figure 40A:
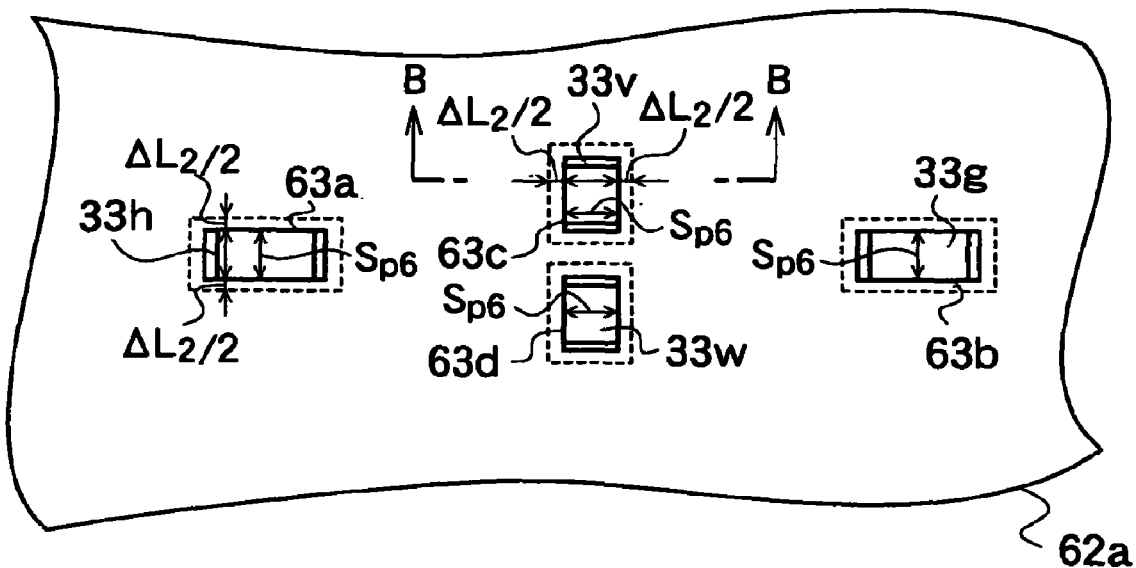
FIG. 40A is a plane view in process after process shown in FIG. 39 for explaining an example of a method for forming a pattern according to the second embodiment of the present invention.
Figure 40B:
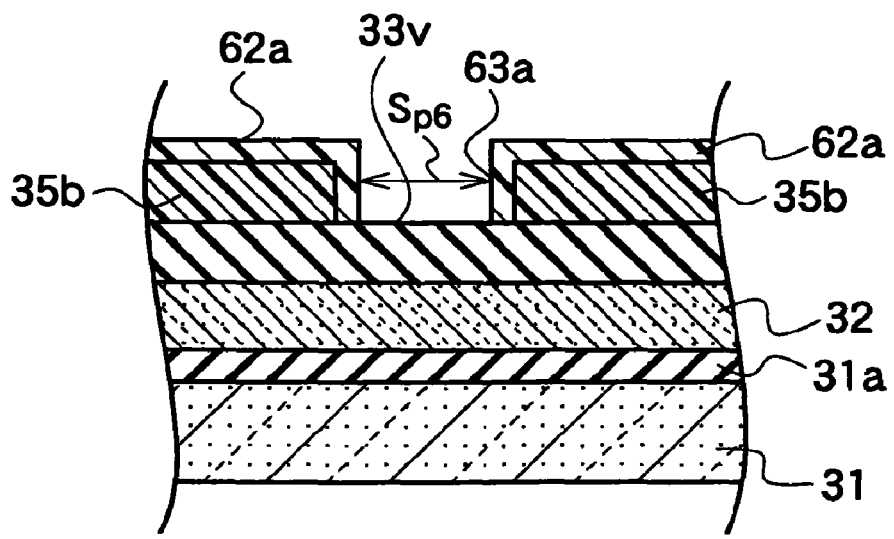
FIG. 40B is a sectional view at B-B shown in FIG. 40A.
Figure 41:
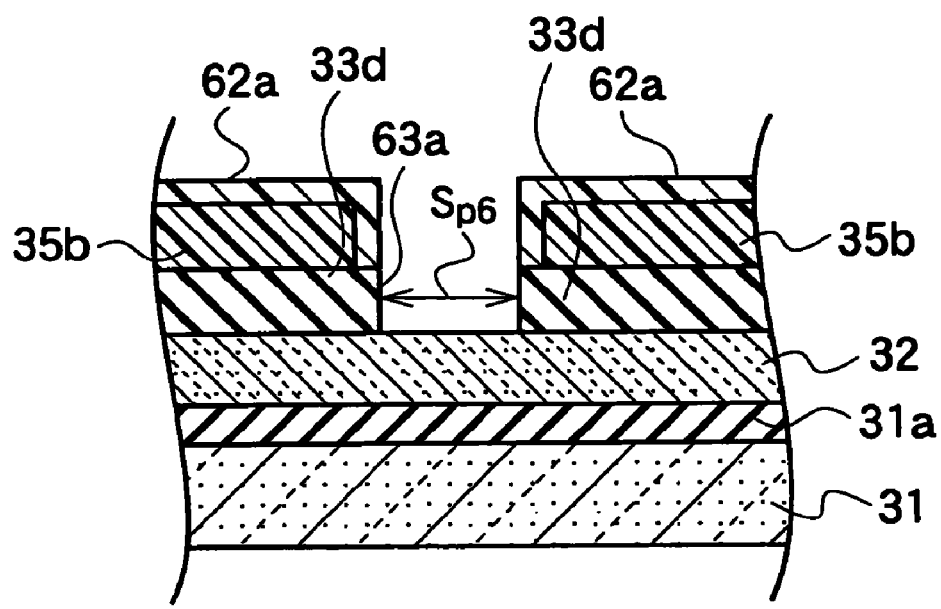
FIGS. 41 and 42 is sectional views in processes after process shown in of FIG. 40B for explaining an example of a method for forming a pattern according to the second embodiment of the present invention.

(d) Next, an overcoat method is performed to the second resist pattern 35b. First, as shown in FIG. 38, an over-coat film 62 made of water-soluble polymer or the like is deposited on the second resist pattern 35b and the exposed part of the underlying mask pattern 33c. Subsequently, this resultant is subjected to heat treatment (baking) at a temperature lower than that a temperature creating plastic deformation of the second resist pattern 35b. Consequently, as shown in FIG. 39, the water-soluble polymer is changed to be insoluble due to the polymer's crosslinking reaction with the acid diffused from the second resist pattern 35b, thus forming a mixed layer 62a where part of the second resist pattern 35b and part of the over-coat film 62 are mixed. A residual over-coat film 62b other than the mixed layer 62a is removed by use of a solvent such as water. As a result, the mixed layer 62a having rectangular window portions 63a, 63b, 63c, and 63d that are narrower than the window portions 36e, 36f, 36g, and 36h, respectively, by $\Delta L_2$ ($=\Delta D_1$), is delineated as shown in FIGS. 40A and 40B. The underlying mask pattern 33c is exposed in the interiors of the window portions 63a, 63b, 63c, and 63d. The window portions 63a and 63b expose parts of the connection portions 33g and 33h of the underlying mask pattern 33c, respectively, each by a length of a target space width $S_{p6}$ that is smaller than the minimum line width $W_{min}$ with which a pattern can be optically resolved by a projection exposure system. The window portions 63c, and 63d also expose parts of the thin line portions 33v and 33w of the underlying mask pattern 33c, respectively, each by a length of the space width $S_{p6}$. Next, with the mixed layer 62a and second resist pattern 35b as an etching mask, part of the underlying mask pattern 33c is selectively removed by RIE or the like, thereby dividing each of the thin line portions 33v and 33w and connection portions 33g and 33h of the underlying mask pattern 33c into two portions. As a result, an underlying mask pattern (insulator pattern) 33d as shown in FIG. 41 is delineated. The mixed layer 62a and the second resist pattern 35b are removed by use of a resist remover or the like.

Figure 42:
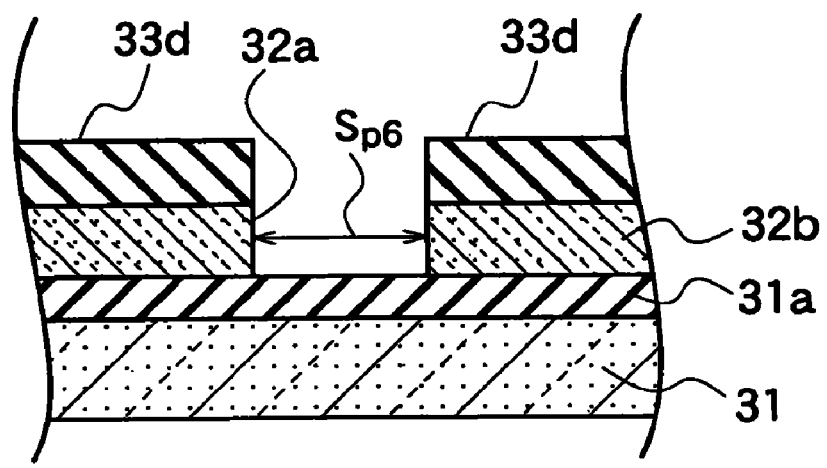
Figure 43A:
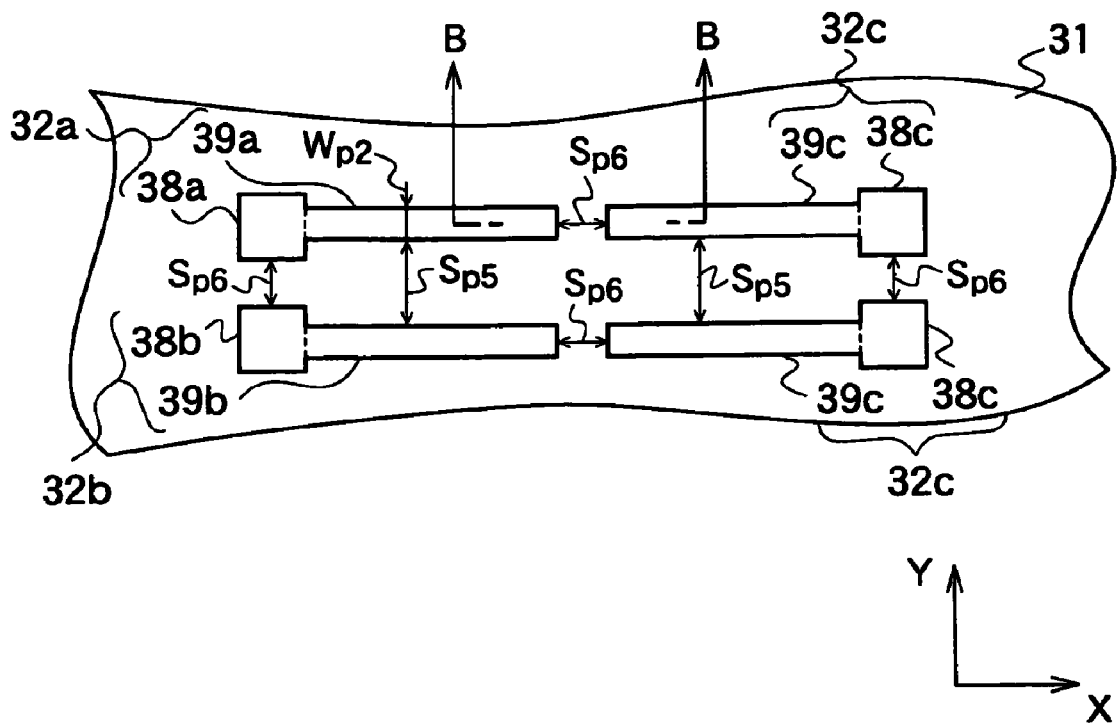
FIG. 43A is a plane view in process after process shown in of FIG. 42 for explaining an example of a method for forming a pattern according to the first embodiment of the present invention.
Figure 43B:
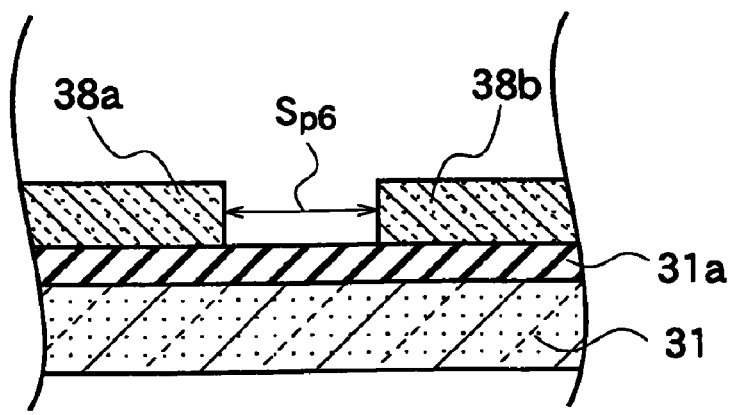
FIG. 43B is a sectional view at B-B shown in FIG. 43A.

(e) Next, as shown in FIG. 42, part of process-target film 32 is selectively removed using the underlying mask pattern 33d as an etching mask, by such means as RIE, and thus four process-target film patterns 32a to 32d (the process-target film patterns 32c, 32d are illustrated in FIGS. 43A and 43B) are delineated. The underlying mask pattern 33d is removed using a removent such as HF. As shown in FIGS. 43A and 43B, the process-target film patterns 32a, 32b, 32c, and 32d include thin line portions 39a, 39b, 39c, and 39d extending with the line width $W_{p2}$ which are separated from each other by the target space width $S_{p6}$, and the rectangular portions 38a, 38b, 38c, and 38d connected to the ends of the thin line portions 39a, 39b, 39c, and 39d respectively.

According to the second embodiment of the present invention, it is possible to delineate the process-target film patterns 32a, 32b, 32c, and 32d having both the target line width $W_{p2}$ which is smaller than the minimum line width with which a pattern can be optically resolved by a projection exposure system, and the space width $S_{p6}$ which is smaller than the minimum space width $S_{min}$ with which a pattern can be optically resolved by a projection exposure system.

Note that, the target line width $W_{p2}$ does not need to be smaller than the minimum line width $W_{min}$. That is, the target line width $W_{p2}$ may be equal to, or may be larger than, the minimum line width $W_{min}$. When the target line width $W_{p2}$ is larger than the minimum line width $W_{min}$, it is possible to obtain an increased lithography margin corresponding to a difference quantity from the minimum line width $W_{min}$ and the resizing quantity $\Delta L_1$ in the first resist pattern 34a.

Moreover, the target space width $S_{p3}$ does not need to be smaller than the minimum space width $S_{min}$. That is, the target space width $S_{p3}$ may be equal to, or may be larger than, the minimum space width $S_{min}$. When the target space width $S_{p3}$ is larger than the minimum space width $S_{min}$, it is possible to obtain an increased lithography margin, according to a difference quantity from the minimum space width $S_{min}$, and the space width reducing quantity $\Delta L_2$ by the overcoat method, in the second resist pattern 35a.

[First Modification]

Figure 44A:
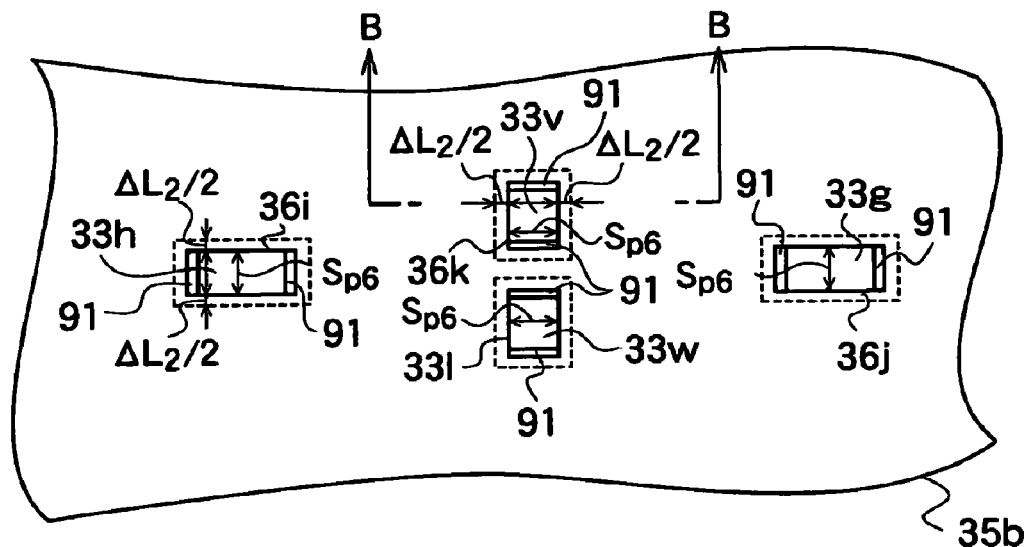
FIG. 44A is a plane view for explaining an example of a method for forming a pattern according to a first modification of the first embodiment of the present invention.
Figure 44B:
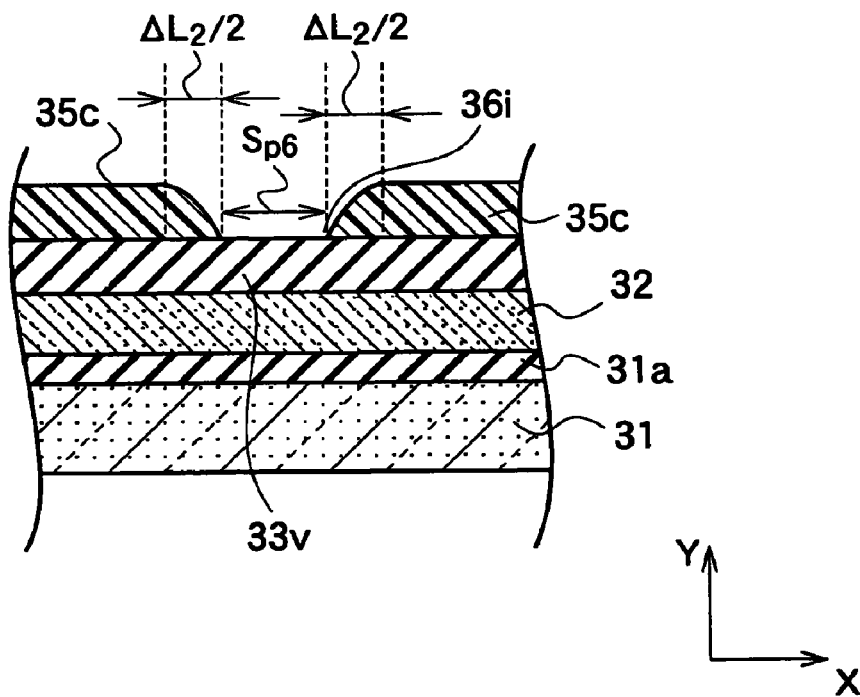
FIG. 44B is a sectional view at B-B shown in FIG. 44A.
Figure 45:
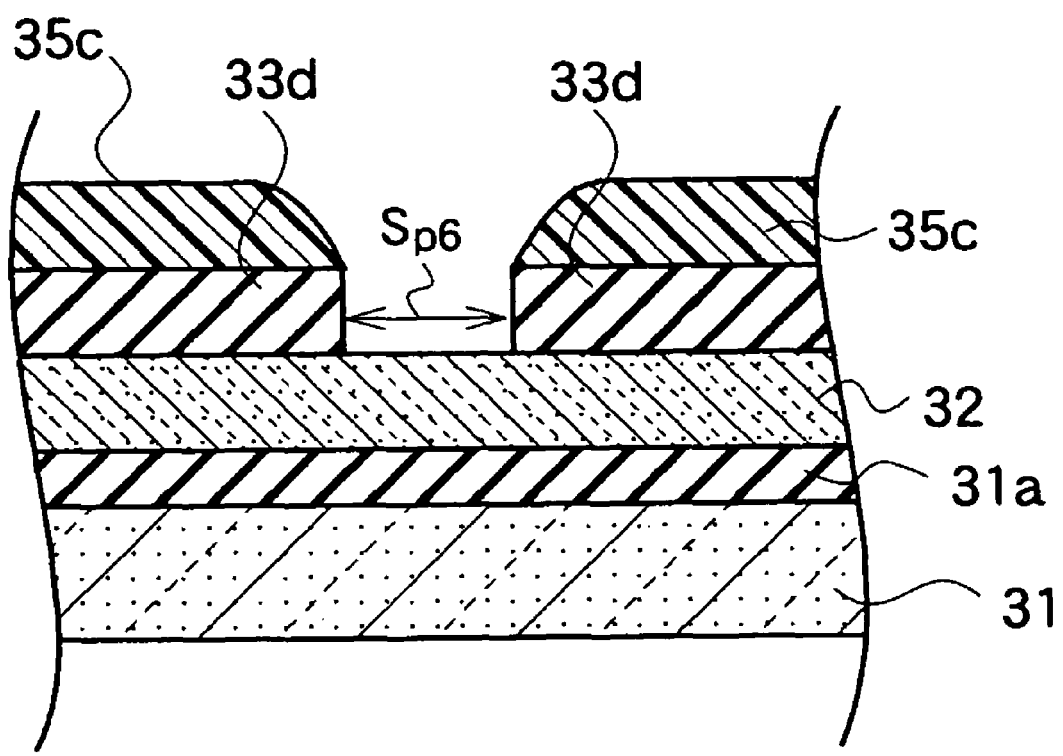
FIG. 45 is sectional view for explaining an example of a method for forming a pattern according to the first modification of the first embodiment of the present invention.

A method for forming a pattern according to a first modification of the second embodiment of the present invention is different from the method for forming a pattern according to the second embodiment in that a TF process utilizing a thermal plastic deformation characteristic of a resist is used as shown in FIGS. 44A to 45, instead of the overcoat method shown in FIGS. 38 to 41.

(a) By subjecting the second resist pattern 35b shown in FIGS. 37A and 37B to heat treatment, a second resist pattern 35c is delineated which has window portions 36i, 36j, 36k, and 36l as shown in FIGS. 44A and 44B. The window portions 36i and 36j are obtained by isotropically reducing the window portions 36e and 36f, respectively, each by a space width reducing quantity $\Delta L_2$ ($=\Delta D_2$) and each have a side with a length of the target space width $S_{p6}$ in the Y-axis direction. The window portions 36k and 36l are obtained by isotropically reducing the window portions 36g and 36h, respectively, each by $\Delta L^2$. Note that it is possible to control the space width reducing quantity $\Delta L_4$ by which the window portions 36e, 36f, 36g, and 36h of the second resist pattern 35b are reduced through the TF process, by controlling temperature during the heat treatment, duration thereof, the thickness of the second resist pattern 35b, and the like.

(b) Next, as shown in FIG. 45, thin line portions 33v and 33w and connection portions 33g and 33h of the underlying mask pattern 33c are divided respectively, by removing part of the underlying mask pattern 33c selectively with second resist pattern 35c as an etching mask, by RIE. Consequently, an underlying mask pattern (isolation pattern) 33d is delineated. The second resist pattern 35c is removed by using a resist remover. Since other procedures which are substantially the same as the procedures shown in FIGS. 11, 31 to 37B, and 42 to 43B, repeated description is omitted.

According to the first modification of the second embodiment of the present invention, when the TF process shown in FIGS. 44A to 45 is adopted instead of the overcoat method shown in FIGS. 38 to 54, it is also possible to delineate the process-target film patterns 32a, 32b, 32c, and 32d having both the line width $W_{p2}$, which is smaller than the minimum line width $W_{min}$ with which a pattern can be optically resolved by a projection exposure system, and the space width $S_{p6}$, which is smaller than the minimum space width $S_{min}$ with which a pattern can be optically resolved by a projection exposure system.

[Second Modification]

Figure 46:
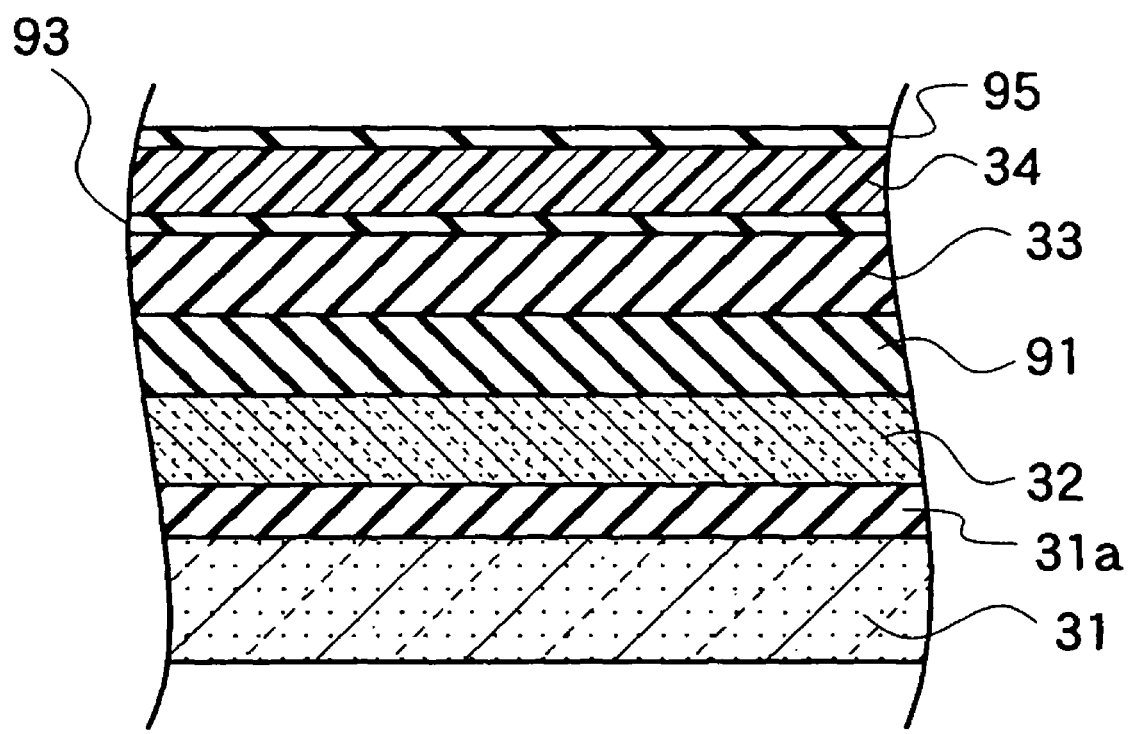
FIGS. 46 to 50 are sectional views for explaining an example of a method for forming a pattern according to a second modification of the first embodiment of the present invention.

As shown in FIG. 46, a method for forming a pattern according to a second modification of the second embodiment of the present invention is different from the method shown in FIG. 1 in that an auxiliary underlying mask film 91, a first anti-reflection film 93, and an anti-reflection film 95 is deposited.

(a) A gate oxide film (first insulator) 31a, a process-target film 32 made of polycrystalline silicon or the like, and an auxiliary underlying mask film (third insulator) 91 are sequentially deposited on a semiconductor substrate 31 shown in FIG. 46 by CVD or the like. The material of the auxiliary underlying mask film 91 is selected depending on an underlying mask film; for example, the auxiliary underlying mask film 91 is a silicon nitride film ($Si_3N_4$ film). That is, an underlying mask film (second insulator) 33 which has a higher etching rate than that of the auxiliary underlying mask film 91 is deposited on the auxiliary underlying mask film 91 by CVD or the like. For the underlying mask film 33, when the auxiliary underlying mask film 91 is a nitride film, a silicon oxide film ($SiO_2$ film) can be selected, for example. That is, a combination of the materials of the auxiliary underlying mask film 91 and the underlying mask film 33 are selected so that the etching rate of the underlying mask film 33 is, e.g., about 10 to 1000 times as high as the etching rate of the auxiliary underlying mask film 91.

(b) Next, a first anti-reflection film 93 is deposited on the underlying mask film 33 by vacuum evaporation, sputtering, or the like. Subsequently, a first resist film 34 is spin-coated on the first anti-reflection film 93. Thereafter, a second anti-reflection film 95 is deposited on the first resist film 34 by vacuum evaporation, sputtering, or the like. For the material of the first and second anti-reflection films 93 and 95, it is possible to use organic translucent resin or the like capable of being spin-coated. Apart from this, it is possible to use an inorganic material, such as a silicon oxynitride (SiON) or a titanium oxide (TiO), capable of being deposited by CVD.

Figure 47:
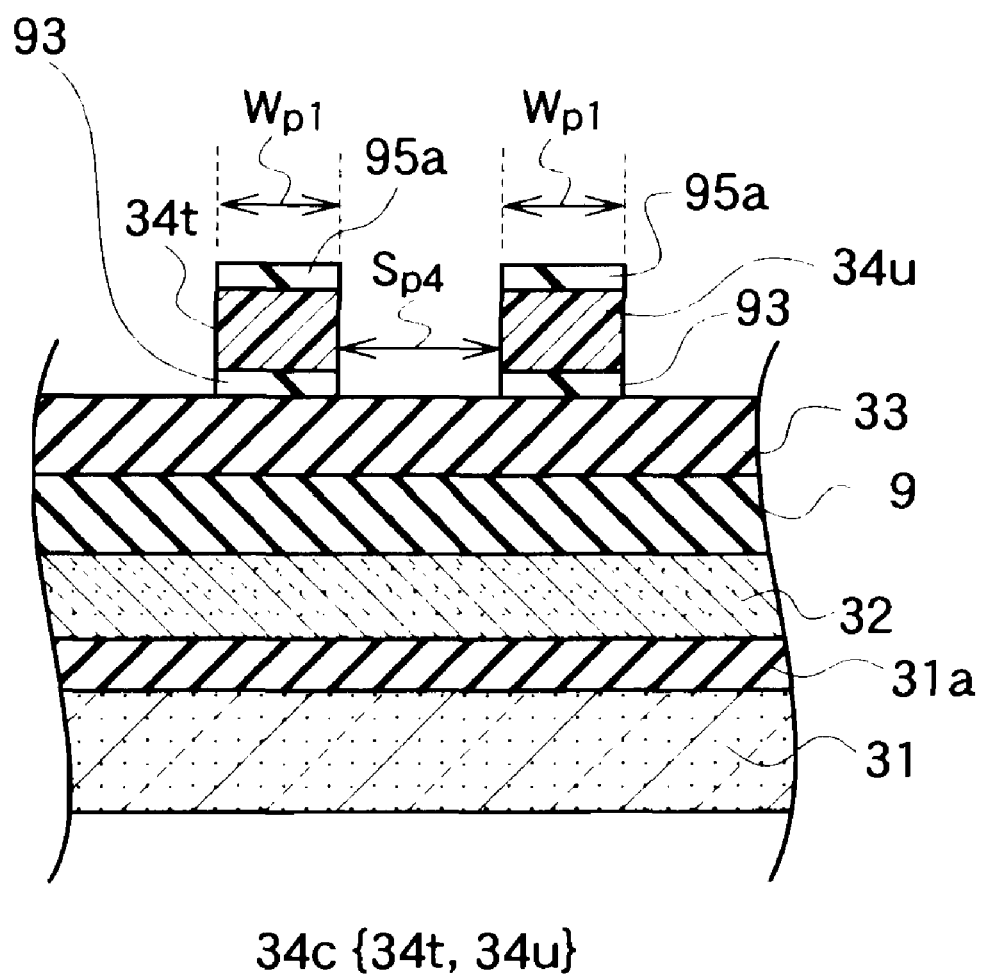

(c) Next, the first mask 40 shown in FIG. 31 is mounted on an unillustrated projection exposure system, and then the pattern of the first mask 40 is transferred onto the first resist film 34 through the second anti-reflection film 95. At this time, a complex refractive index (whose real component corresponds to a refraction index (n), and whose imaginary component corresponds to an extinction coefficient (k)) at the exposure wavelength are adjusted by the first anti-reflection film 93, whereby the reflectance of the exposure light can be controlled. Moreover, variation of the line width due to the influence of the bases such as the underlying mask film 33 can be prevented by the second anti-reflection film 95. Thereafter, the first resist film 34 is developed, and thus a first resist pattern 34c with the line width $W_{p1}$ is formed as shown in FIG. 47. The first and second anti-reflection films 93 and 95 are patterned into the same shape as the first resist pattern 34c.

Figure 48:
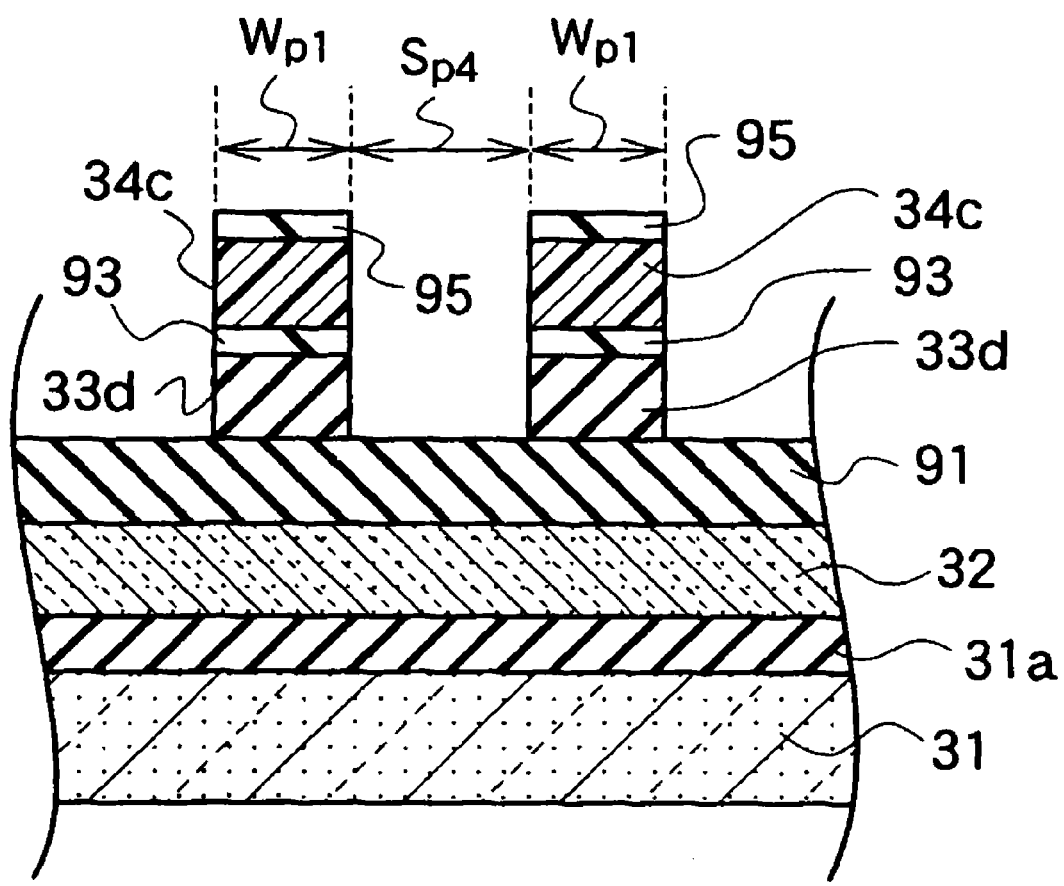
Figure 49:
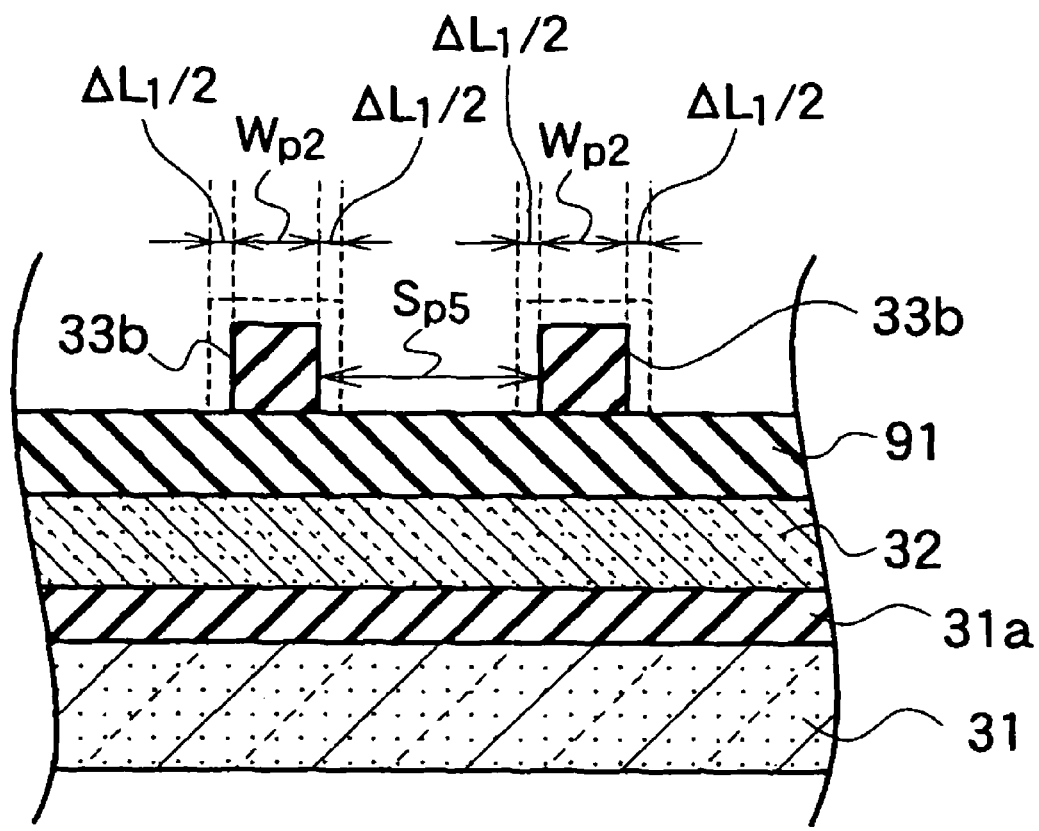

(d) Next, parts of the underlying mask film 33 are selectively removed by RIE or the like, using the first resist pattern 34c, and the patterned first anti-reflection film 93 and the patterned anti-reflection film 95 as etching masks. Consequently, as shown in FIG. 48, an underlying mask pattern (isolation patterns) 33d is delineated. The first resist pattern 34c, the first anti-reflection film 93 and the anti-reflection film 95 are removed by using a resist remover. Since the procedures after the above step is substantially the same as procedures shown in FIGS. 36 to 41, repeated description is omitted.

Figure 50:
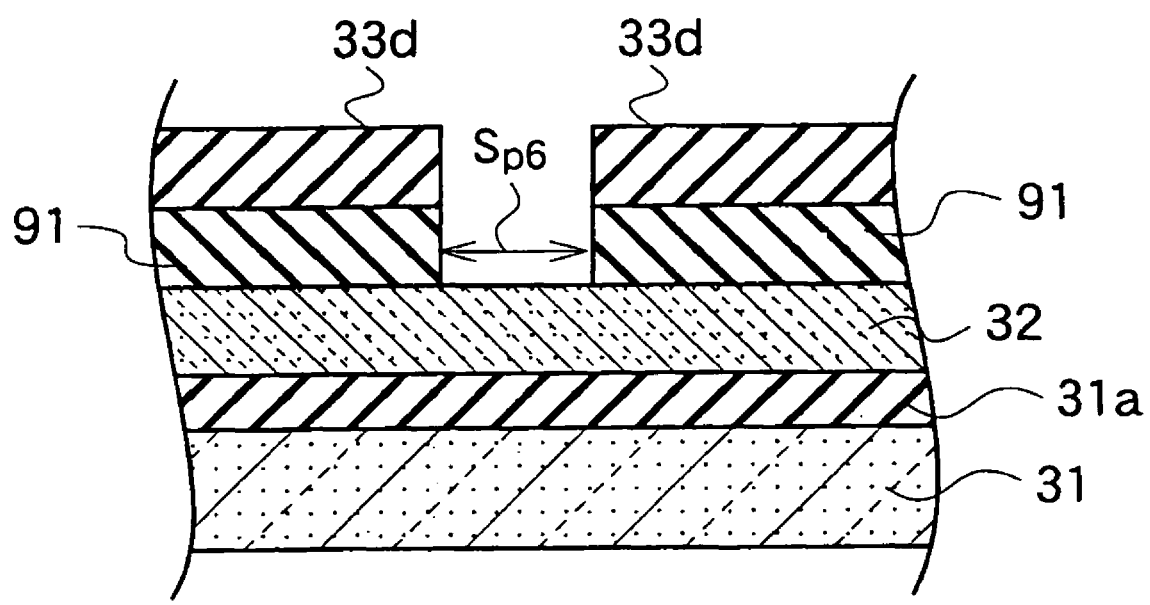

(e) Next, as shown in FIG. 50, parts of the auxiliary underlying mask film 91 are selectively removed by using hot phosphoric acid or the like, using the underlying mask pattern 33d as an etching mask. Consequently, an auxiliary underlying mask pattern 91a is delineated. Then, parts of the process-target film 32 are selectively removed by RIE or the like, using the auxiliary underlying mask pattern 91a and the underlying mask pattern 33d as etching masks. Consequently, four process-target film patterns 32a, 32b, 32c, and 32d (the process-target film patterns 32k and 32l are unillustrated) are delineated. The auxiliary underlying mask pattern 91a and the underlying mask pattern 33c are removed by use of corresponding etching liquids.

According to the second modification of the second embodiment of the present invention, it is possible to delineate the process-target film patterns 32a, 32b, 32c, and 32d having both the line width $W_{p2}$ which is smaller than the minimum line width $W_{min}$ with which a pattern can be optically resolved by a projection exposure system, and the space width $S_{p6}$ which is smaller than the minimum space width $S_{min}$ with which a pattern can be optically resolved by a projection exposure system.

Furthermore, by using the first anti-reflection film 93, it is possible to adjust a complex refractive index of a wavelength of exposure, and thus the reflectance of exposure light can be prevented. Furthermore, by using the anti-reflection film 95, it is possible to prevent change of line width by the underlying mask film 33 or the like.

Furthermore, since the auxiliary underlying mask film 91 is used, it is possible to slim the underlying mask pattern 33d by over etching (slightly etching) the underlying mask film 33, using the auxiliary underlying mask film 91 as an etching stop layer when an etching selectivity is not insufficient between the auxiliary underlying mask film 91 and the process-target film 32. In this case, it is also possible process to the process-target film 32 using the underlying mask pattern 33c and the auxiliary underlying mask pattern 91a. Note that a silicon nitride ($Si_3N_4$) film or the like which is not etched by a oxide etchant may be used as the auxiliary underlying mask film 91 when the underlying mask film 33 is a oxide film, and the underlying mask film 33 is to be slightly etched using a etching liquid for etching the oxide film.

Other Embodiments

In the methods for generating mask data according to the first and second embodiments of the present invention, the space width $S_{p3}$, by which the thin line portions 112a, 112b, 112c, and 112d shown in FIG. 2 are separated from each other, may be different from the space width $S_{p3}$, by which the rectangular portions 111a, 111b, 111c, and 111d are separated from each other. Furthermore, Various types of design data having various types of shapes and dimensions can be adopted, in addition to the design data 110 and 120 shown in FIG. 2. For example, the thin line portions 112a and 112b may be swerved each other in the Y-axis direction, if facing ends of the thin line portions 112a and 112b are separated from each other by the space width $S_{p3}$. Furthermore, the thin line portion 112a and 112b do not have striped-shapes.

Furthermore, the design patterns 110a, 110b, 110c, and 110d shown in FIG. 2 which are equally enlarged, may have thin line portions 112a, 112b, 112c, and 112d enlarged in the Y-axis direction only. Furthermore, in methods for forming a pattern according to the first and second embodiment of the present invention, the first resist patterns 34a and 34c are equally reduced, the thin line portions 34p and 34q may be reduced in only the Y-axis direction, based on a method of generating mask data.

Furthermore, the positive OPC patterns 143a, 143b, 143c, and 143d, the negative OPC patterns 144a and 144b, and the negative patterns 161a, 161b, 161c, and 161d shown in FIGS. 6A and 6B are added in order to prevent changing the shapes of patterns on a wafer by optical proximity effects in exposure process, and so that the shapes of the patterns transferred correspond to the patterns of the first mask data 130 and the second mask data 150. Thus shapes and positions of OPC patterns are not limited.

Furthermore, sets of masks according to the first and second embodiment of the present invention, the first mask patterns 11 and 41 and the second mask patterns 21 and 51 are explained as examples only and shapes of a fist mask pattern and a second mask pattern are not limited. For example, even though stripe-shaped thin line patterns 11a and 11b are explained, thin line patterns do not need to have a stripe-shape. Furthermore, the positive OPC patterns 13a, 13b, 13c, and 13d, and the negative patterns 14a, 14b, 23a, 23b, 23c, and 23d, are patterns for correcting the shapes of the mask patterns placed on the first and second masks 10 and 20 in order to prevent optical proximity effects when the patterns of the first mask 10 and the second mask 20 are transferred and to obtain desired patterns on a semiconductor substrate. Therefore, the shapes of OPC patterns, and the shapes of mask patterns on which OPC is performed are not limited. That is, the shapes of patterns after OPC can be change by conditions of exposure processes.

Furthermore, in the OPC process according to the first and second embodiment of the present invention, OPC patterns may be generated by hand or the so called OPC tools. Furthermore, sub-resolution assist features (SRAF) and resolution enhancement technology (RET) such as an alternating phase shift mask may be used to obtain the shapes of patterns on a wafer corresponding to the shapes of the patterns of the first and second masks 130 and 150.

Furthermore, in a method for forming patterns according to the first and second embodiments of the present invention, negative resist films can be used as the first resist film 34 and the second resist film 35 instead of positive resist film. The relationship of permeate and shade of the mask patterns 11 and 41 of the first masks 10 and 40, and window portion of the second masks 20 and 50 may be reversed when a negative resist film is used. As the underlying mask film 33 shown in FIGS. 11 and 46, and the auxiliary underlying mask film 91, silicon oxide ($SiO_2$), silicon hydroxide ($SiO_xH_y$), amorphous silicon, poly-silane, titanium oxide ($TiO_2$), titanium nitride (TiN), tungsten silicide (WSi), tungsten (W), and novorack resin cured by electron beam or ultraviolet (UV) ray, and the like can be used instead of silicon nitride ($Si_xN_y$) and silicon oxide nitride ($SiO_xN_y$).

Furthermore, in a method for forming a pattern according to the first embodiment of the present invention, the auxiliary underlying mask film 91 shown in FIG. 46 may also be deposited between the process-target film 32 shown in FIG. 11 and the underlying mask film 33. In a method for forming a pattern according to the second embodiment of the present invention, another plurality of auxiliary underlying mask films, which has a sufficient ratio of etching selectivity to the auxiliary underlying mask film 91 can be deposited under the auxiliary underlying mask film 91 shown in FIG. 46. In the procedure shown in FIG. 46, only one of the first anti-reflection film 93 and the anti-reflection film 95 may be deposited.

Moreover, it is possible to form the mixed layer 62a including the window portions 63a, 63b, 63c, and 63d having a side with the target space width $S_{p6}$ by an overcoat method after a TF process for reducing the window portions of the second resist pattern 35b, instead of using the overcoat method shown in FIGS. 38 to 41 and the example of using a TF process shown in FIGS. 44A and 45 are explained.

Various modifications will become possible for those skilled in the art after receiving the teachings of the present disclosure without departing from the scope thereof.

What is claimed is:

1. A method for forming a pattern comprising:
   depositing a process-target film on a semiconductor substrate;
   depositing an underlying mask film on the process-target film;
   delineating a first resist film on the underlying mask film;
   delineating a first resist pattern by transferring a pattern of a first mask onto the first resist film;
   delineating an underlying mask pattern having narrower line width than a line width of the first resist pattern by removing a part of the underlying mask film;
   delineating a second resist film on the underlying mask pattern;

delineating a second resist pattern having a window portion for exposing a part of the underlying mask pattern, by transferring a pattern of a second mask onto the second resist film; and removing a part of the underlying mask pattern selectively, using the second resist pattern as an etching mask.

2. The method of claim 1, wherein forming the underlying mask pattern comprises:

forming a resized resist pattern by slimming the first resist pattern;

removing a part of the underlying mask film selectively, using the resized resist pattern as an etching mask; and removing the resized resist pattern.

3. The method of claim 1, wherein forming the underlying mask pattern comprises:

forming a resized resist pattern by slimming the first resist pattern, and forming the underlying mask pattern by removing a part of the underlying mask film selectively at the same time; and removing the resized resist pattern.

4. The method of claim 1, wherein forming the underlying mask pattern comprises:

forming a pattern of the underlying mask film by removing a part of the underlying mask film selectively with the first resist pattern as an etching mask;

removing the first resist pattern; and forming the underlying mask pattern by slimming the pattern of the underlying mask film.

5. The method of claim 1, further comprising removing a part of the process-target film, using the underlying mask pattern which a part thereof is selectively removed as an etching mask.

6. The method of claim 1, further comprising reducing the window portion of the second resist pattern by a thermal process so as to have a smaller size than a minimum space width with which a pattern can be optically resolved by a projection exposure system, between the forming of the second resist pattern and the removing of a part of the underlying mask pattern.

7. The method of claim 1, further comprising, between the forming of the second resist pattern and the removing of a part of the underlying mask pattern:

depositing an over-coat film on the second resist pattern;

forming a mixed layer covering a part of the window portion of the second resist pattern by mixing a part of the second resist pattern and a part of the over-coat film by thermal process; and removing the over-coat film.

8. The method of claim 7, wherein the removing of a part of the underlying mask pattern removes a part of the underlying mask pattern, using the second resist pattern and the mixed layer as etching masks.

9. The method of claim 1, further comprising depositing an auxiliary underlying mask film on the process-target film having a higher etching rate than etching rate of the underlying mask film, between the depositing of the process-target film and the depositing of the underlying mask film.

10. The method of claim 9, further comprising removing a part of the auxiliary underlying mask film, using the underlying mask pattern which a part thereof is selectively removed as an etching mask.

11. The method of claim 1, further comprising depositing a first antireflection film on the process-target film, between the depositing of the underlying mask film and the forming of the first resist film.

12. The method of claim 1, further comprising depositing a second antireflection film on the first resist film, between the forming of the first resist film and the forming of the first resist pattern.

* * * * *